United States Patent
Yokota et al.

(10) Patent No.: US 6,925,615 B2
(45) Date of Patent: Aug. 2, 2005

(54) SEMICONDUCTOR DEVICE HAVING EMBEDDED ARRAY

(75) Inventors: Noboru Yokota, Kawasaki (JP); Hisayoshi Oba, Kawasaki (JP); Noboru Kosugi, Kawasaki (JP); Munehiro Tahara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 237 days.

(21) Appl. No.: 10/067,882

(22) Filed: Feb. 8, 2002

(65) Prior Publication Data

US 2002/0084457 A1 Jul. 4, 2002

Related U.S. Application Data

(62) Division of application No. 09/427,693, filed on Oct. 27, 1999, now Pat. No. 6,555,853.

(51) Int. Cl.[7] .............................................. G06F 17/50
(52) U.S. Cl. ........................ 716/2; 716/7; 716/8; 716/19
(58) Field of Search .............................. 716/2, 7, 8, 19, 716/1, 4; 365/63, 72; 257/E23.151, E23.153

(56) References Cited

U.S. PATENT DOCUMENTS

| | | | |
|---|---|---|---|
| 3,633,268 A | 1/1972 | Engbert | 29/574 |
| 5,610,831 A | * 3/1997 | Matsumoto | 716/19 |
| 5,617,369 A | 4/1997 | Tomishima et al. | 365/230.06 |
| 5,625,568 A | * 4/1997 | Edwards et al. | 716/2 |
| 5,677,641 A | 10/1997 | Nishio et al. | 326/121 |
| 5,798,937 A | * 8/1998 | Bracha et al. | 716/9 |

FOREIGN PATENT DOCUMENTS

JP          8-1948          1/1996

* cited by examiner

*Primary Examiner*—Stacy A. Whitmore
(74) *Attorney, Agent, or Firm*—Westerman, Hattori, Daniels & Adrian, LLP

(57) ABSTRACT

A semiconductor integrated circuit having an embedded array wherein basic cells are arranged in a matrix is designed and manufactured (S1); a test is performed on whether an electrical behavior of a prototype of a semiconductor integrated circuit meets required specifications (S2); if meets, a non-use-area pattern in an embedded array area is detected and removed based on layout data of contact holes to get modified pattern (S4); a mask with a modified pattern is prepared (S5); and the mask is substituted for the mask before modification, thereby manufacturing a semiconductor integrated circuits from which a non-use area is removed (S6).

9 Claims, 33 Drawing Sheets

1A HARD MACRO CELL

SEMICONDUCTOR DEVICE HAVING EMBEDDED ARRAY

This application is a division of prior application Ser. No. 09/427,693 filed Oct. 27, 1999 now U.S. Pat. No. 6,555,853.

BACKGROUND OF THE INVENTION

1. Field of the Invention

The present invention relates to a semiconductor device having an embedded array, a manufacturing method therefor and a storage medium having a program for use in the method.

2. Description of the Related Art

Reduction in power consumption and shortening of development period are required for semiconductor circuits.

A normal-cell design method has a strong point of reducing power consumption in a circuit by designing a cell as small as possible, but together with a fault of an extended design period.

On the other hand, when a circuit is designed using an embedded array in which a plurality of basic cells are arranged in a matrix, there arises an advantage of shortening development period, but in company with weak points of increase in chip area and power consumption, compared with a case where the normal-cell method is applied.

In such a manner, reduction in power consumption and shortening of development period conflict with each other, although both are required to be met.

In the Examined Japanese Patent Application bearing Publication No. Hei 8-1948, there is disclosed a process of designing a semiconductor integrated circuit with using a hard macro cell 1 shown in FIG. 32, in a case where an input 2 and an output 3 is both out of use as a result. An line 5 between the input 2 and a branching point 4 is removed, and further a line 7 between the output 3 and an output end of a block 6 is removed, the block 6, all of whose output end are out of use after the removal of the line 7, is then removed, and a line 9 between an input end of the block 6 and a branch point 8, which is out of use by removal of the block 6, is finally removed. With such a series of removals, a hard macro cell 1A as shown in FIG. 33 can be obtained.

Power consumption of the circuit is reduced by removal of the unnecessary block. Further, capacitance of net is decreased by the sum of capacitance of the removed lines and input capacitance of the input end of the removed block as a result of removal of the unnecessary block and the lines out of use, which contributes to shorten signal propagation delay time.

In this method, however, a hard macro cell with versatile applications is prepared in advance, and circuit blocks and lines, which come to be out of use according to specifications of a selected application, are deleted. Therefore, this method cannot be applied to a case where blocks and lines having no redundancy are formed with adopting an embedded array.

SUMMARY OF THE INVENTION

Accordingly, it is an object of the present invention to provide a semiconductor device having an embedded array, a manufacturing method therefor and a storage medium having a program for use in the method, all of which enable reduction in power consumption by removing an unnecessary area of a transistor included in the embedded array, although a slight extension of a development period has to be overlooked.

In the present invention, there is provided a semiconductor device having an embedded array, the embedded array having basic cells arranged in a matrix, wherein a basic cell has an impurity region part of which is removed, the part corresponding with a missing contact hole.

With the present invention, capacitance of an impurity region itself partly removed and parasitic capacitance between the impurity region and a line thereover are decreased compared with a prior art case corresponding thereto, whereby not only is power consumption reduced, but a signal propagation delay time is shortened, so that an operating speed of a basic cell is improved.

Other aspects, objects, and the advantages of the present invention will become apparent from the following detailed description taken in connection with the accompanying drawings.

DESCRIPTION OF THE PREFERRED EMBODIMENTS

Figure 1:
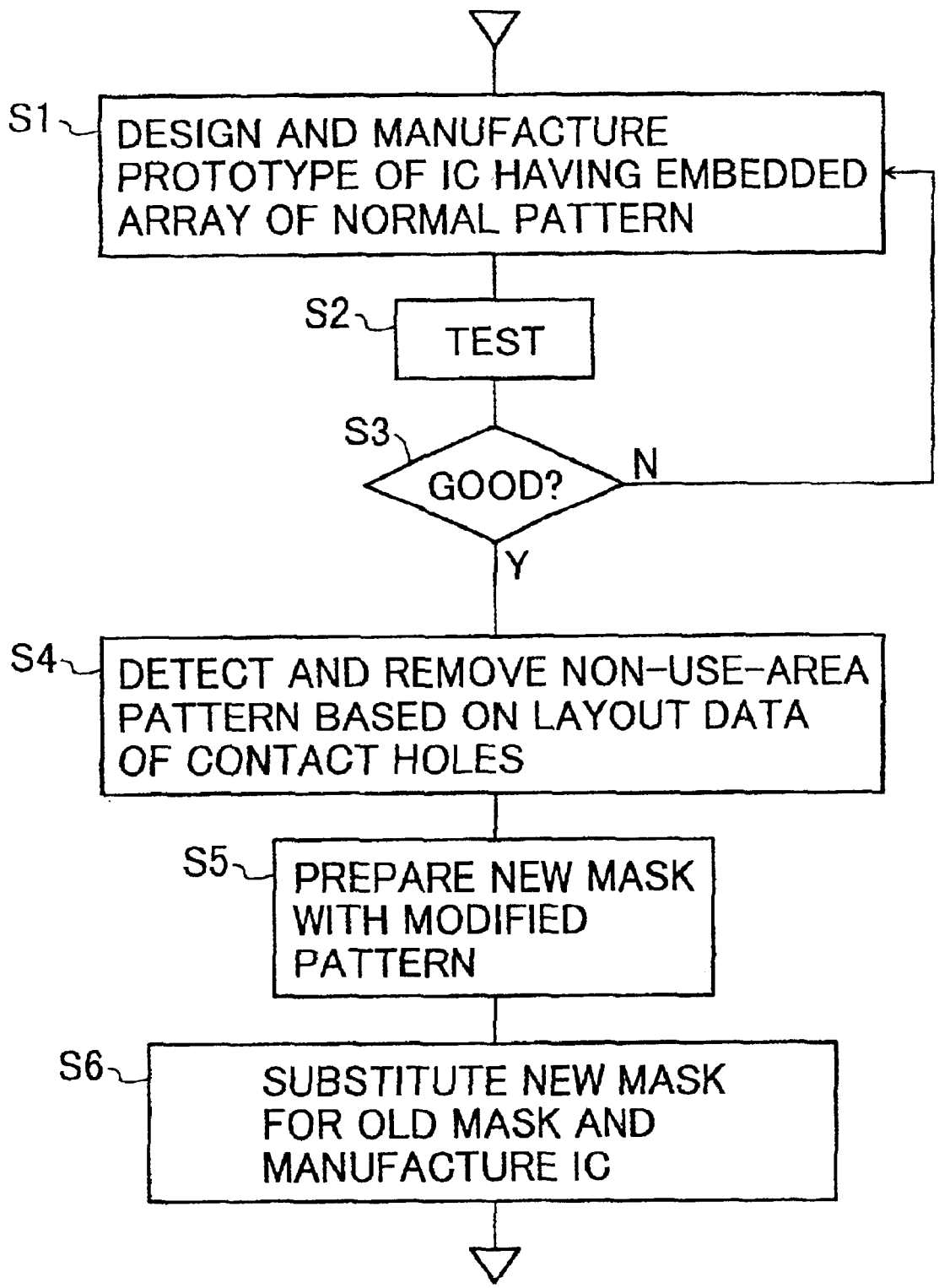
FIG. 1 is a general flow chart showing a method of manufacturing a semiconductor device with an embedded array of a first embodiment in accordance with the present invention.

Referring now to the drawings, wherein like reference characters designate like or corresponding parts throughout several views, preferred embodiments of the present invention are described below.

First Embodiment

FIG. 1 is a general flow chart showing a method of manufacturing a semiconductor device with an embedded array of the first embodiment in accordance with the present invention.

(S1) In a prototype manufacturing stage, as is in a prior art method, a semiconductor integrated circuit having an embedded array of a normal pattern is designed and manufactured.

Figure 3:
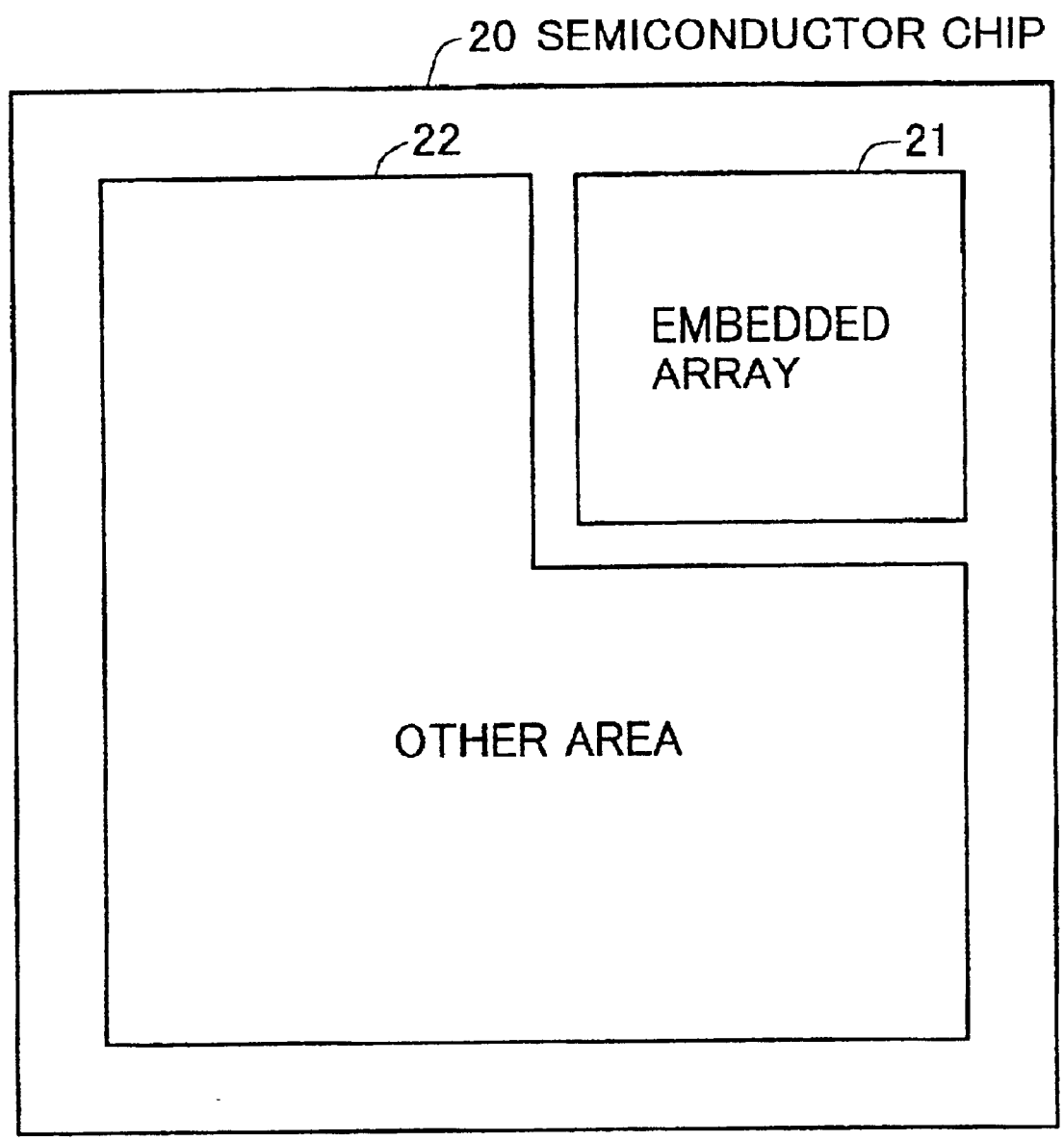
FIG. 3 is a plan view showing a layout including an embedded array in a semiconductor chip.

As shown in FIG. 3, a semiconductor chip is partitioned into an embedded array 21 and another area 22. The area 22 is, for example, a normal cell area or another embedded array area. The semiconductor chip 20 may all be a gate array.

Figure 4:
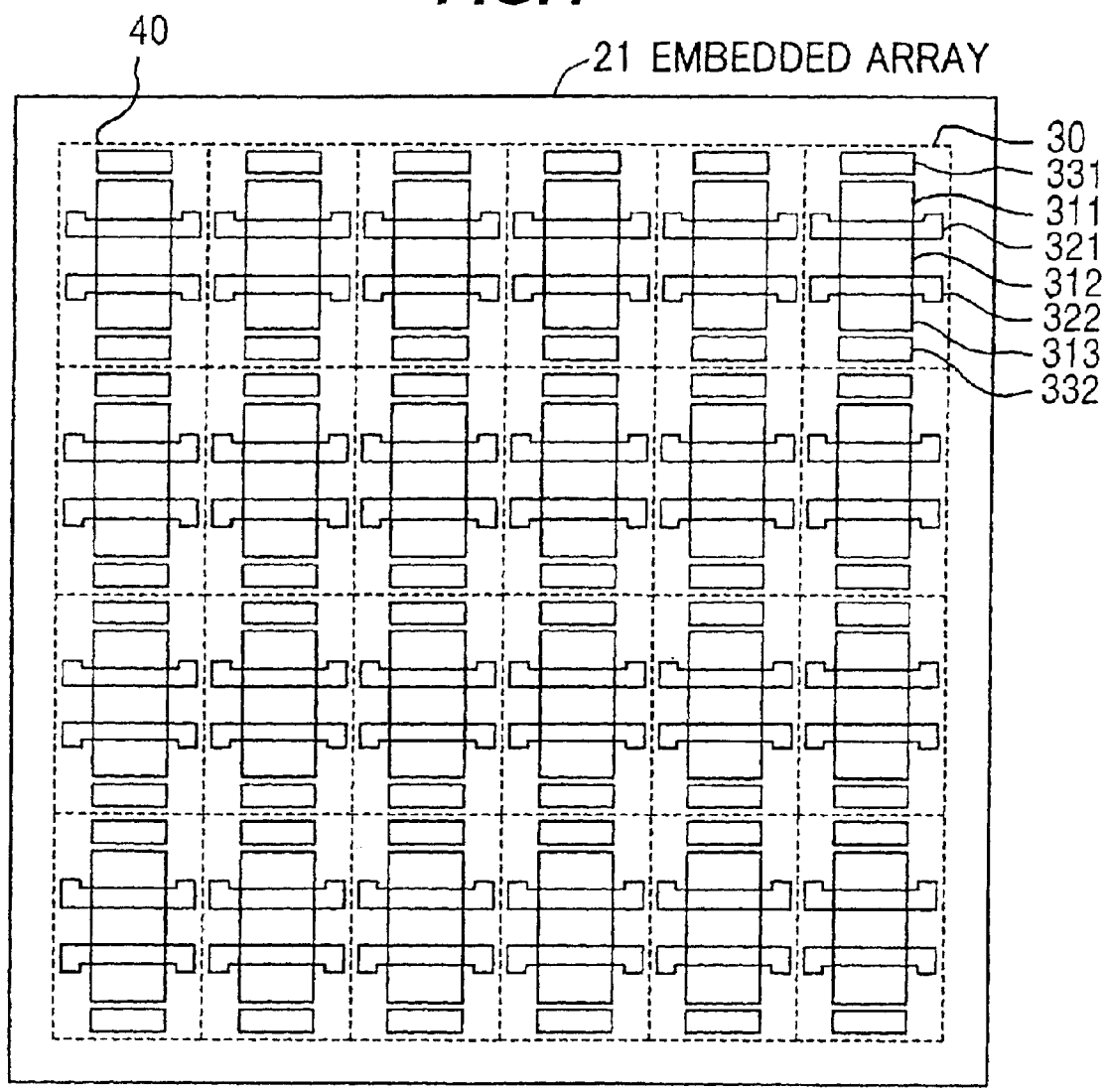
FIG. 4 is a plan view showing a layout pattern of an embedded array.

As shown in FIG. 4, the embedded array 21 has basic cells in a matrix and a desired circuit is formed with metal interconnecting lines not shown.

Figure 5:
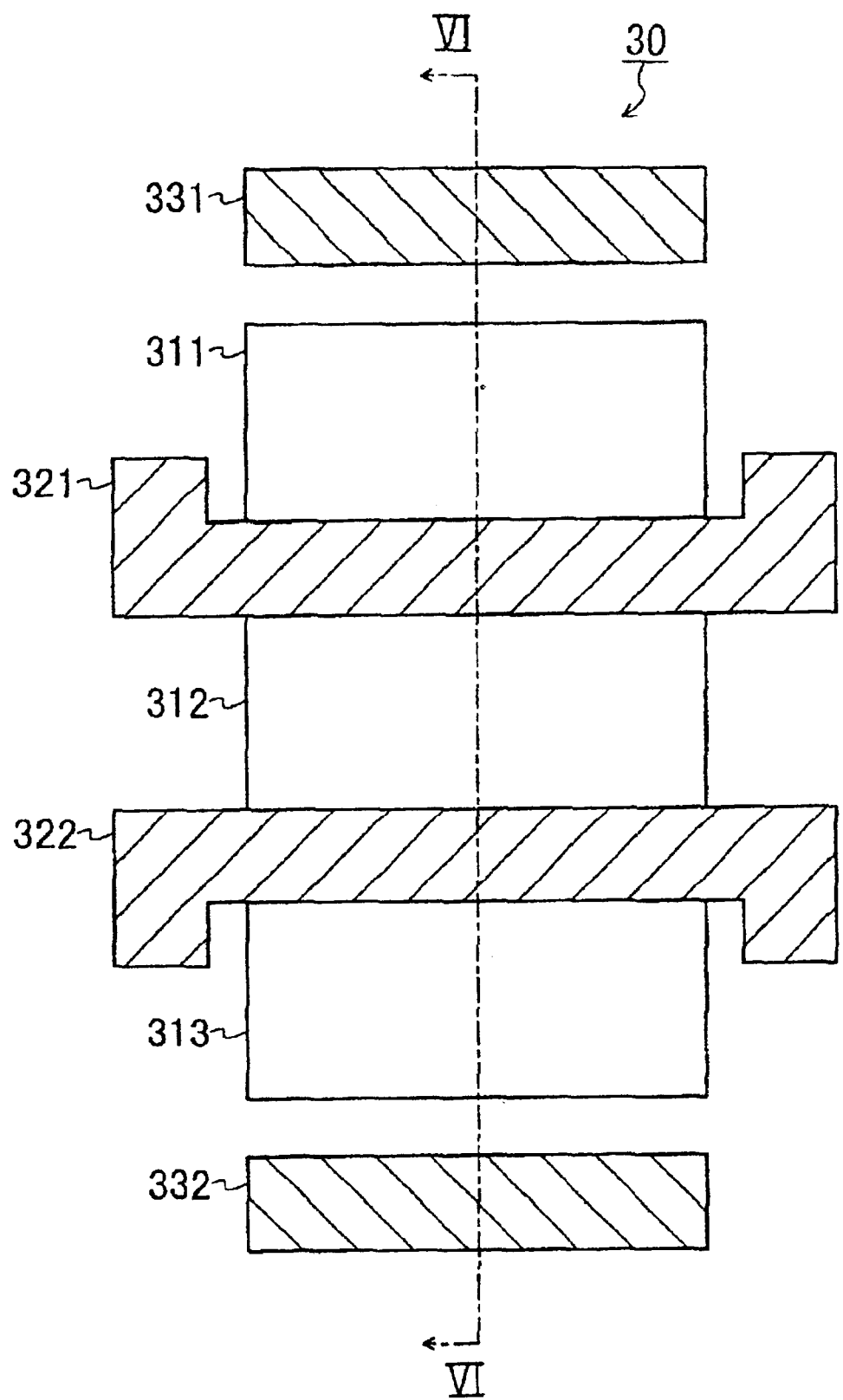
FIG. 5 is an enlarged plan view showing a basic cell in an embedded array.

FIG. 5 is an enlarged plan view of a basic cell 30. In the cell, N-type regions 311 to 313 are formed on a semiconductor substrate, and polysilicon gates 321 and 322 are formed above between the N-type regions 311 and 312, and between the N-type regions 312 and 313. Besides, P⁺-type regions 331 and 332 to each of which a ground potential is applied are formed on the both outermost sides of the N-type regions 311 to 313 almost adjacent thereto so that a reverse bias potential is applied between a source and a substrate.

Figure 6:
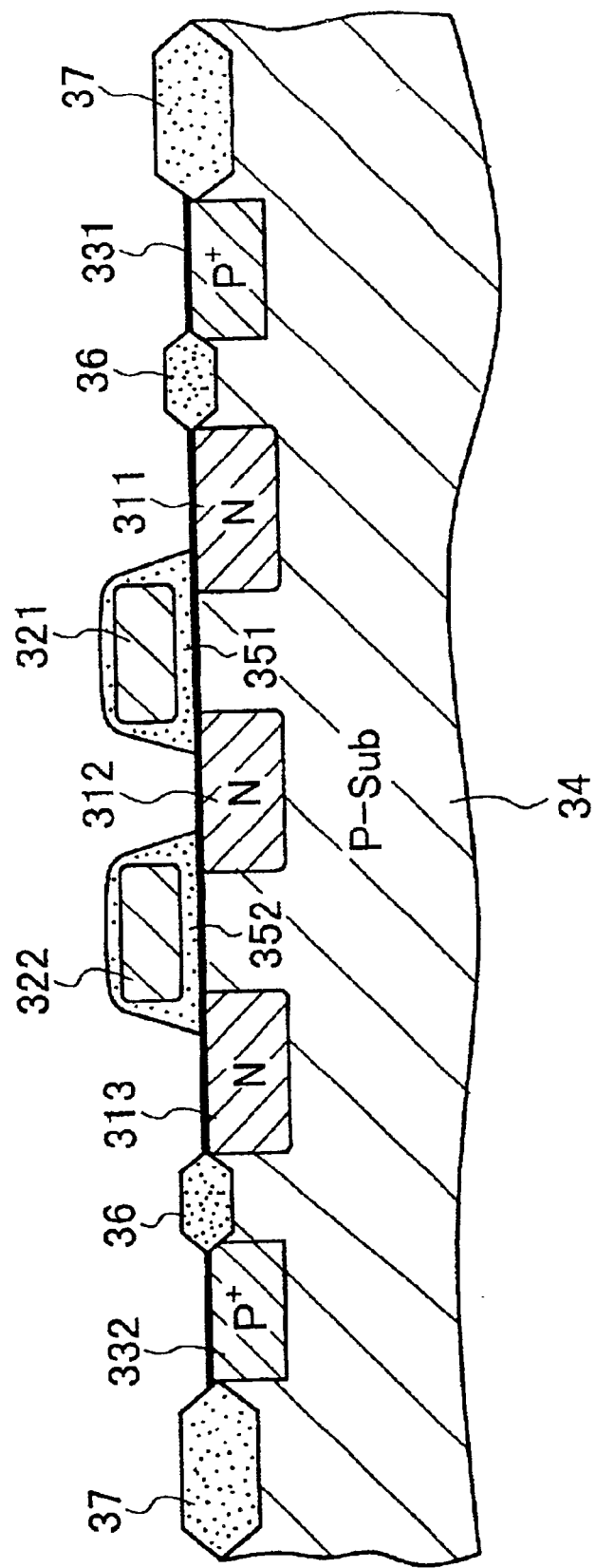
FIG. 6 is a view showing an area taken on line V—V of FIG. 5.

FIG. 6 shows an area taken on line V—V of FIG. 5.

The N-type regions 311 to 313 and the P⁺-type regions 331 and 332 are formed in the P⁺ substrate 34. Reference characters 351 and 352 indicate a gate oxide film and reference characters 36 and 37 indicate field oxide film. An NMOS transistor is constructed of the N-type regions 311 and 312, the gate 332 and the gate oxide film 351. Another NMOS transistor which is serially connected to the above NMOS transistor is constructed of the N-type regions 312 and 313, the gate 322 and the gate oxide film 352.

(S2) A test is performed on whether or not an electrical behavior of a semiconductor integrated circuit manufactured as a prototype meets required specifications.

(S3) If the electrical behavior does not meet the required specifications, a design is corrected so as to meet the required specifications and process returns to step S1 to manufacture a semiconductor integrated circuit again.

Figure 2:
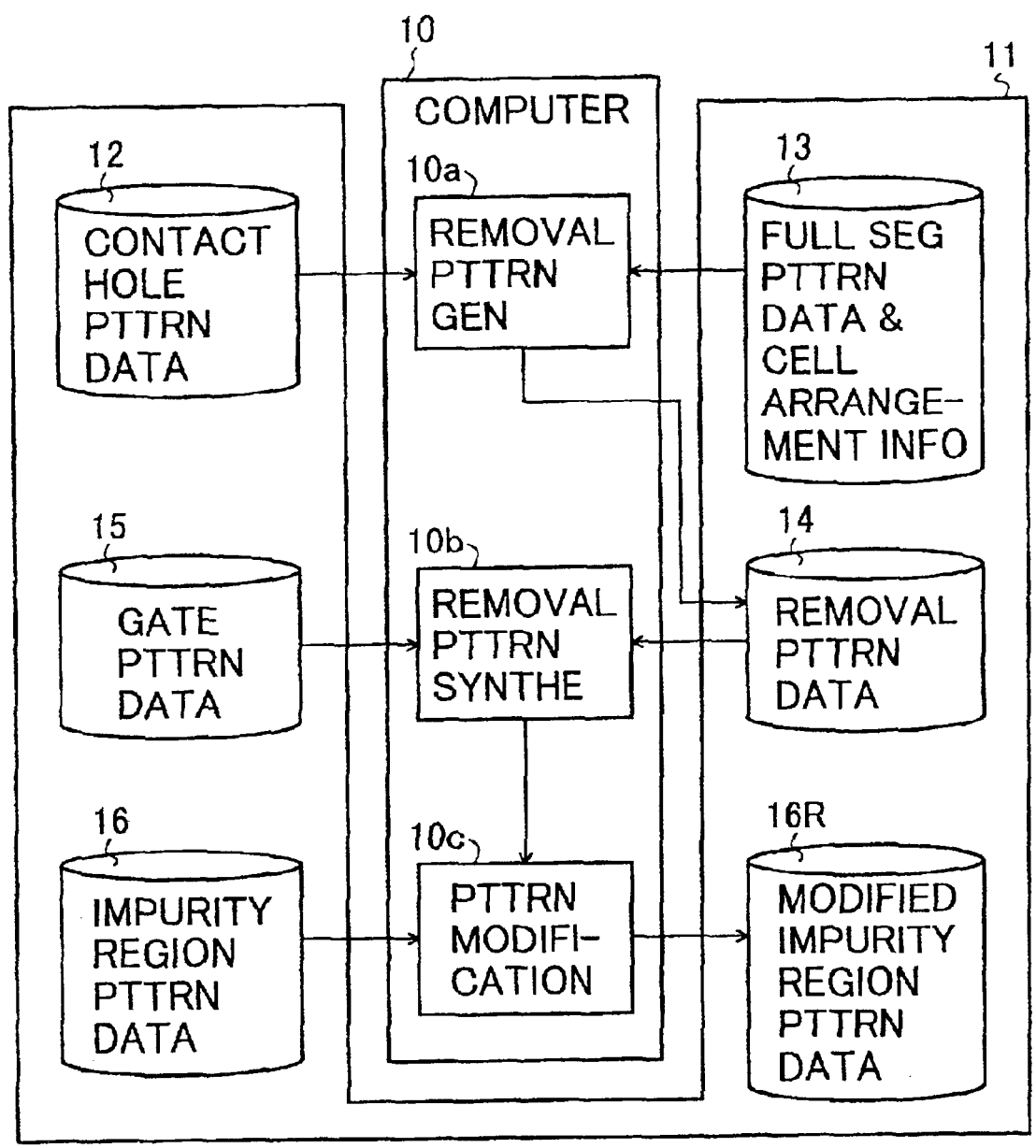
FIG. 2 is a functional block diagram showing an apparatus for performing step S4 of FIG. 1.

(S4) If the electrical behavior meets the required specifications, using an apparatus of FIG. 2 and based on layout data of contact holes, a non-use-area pattern in an embedded array area is detected and removed, whereby layout pattern data of the embedded array are modified.

Figure 7:
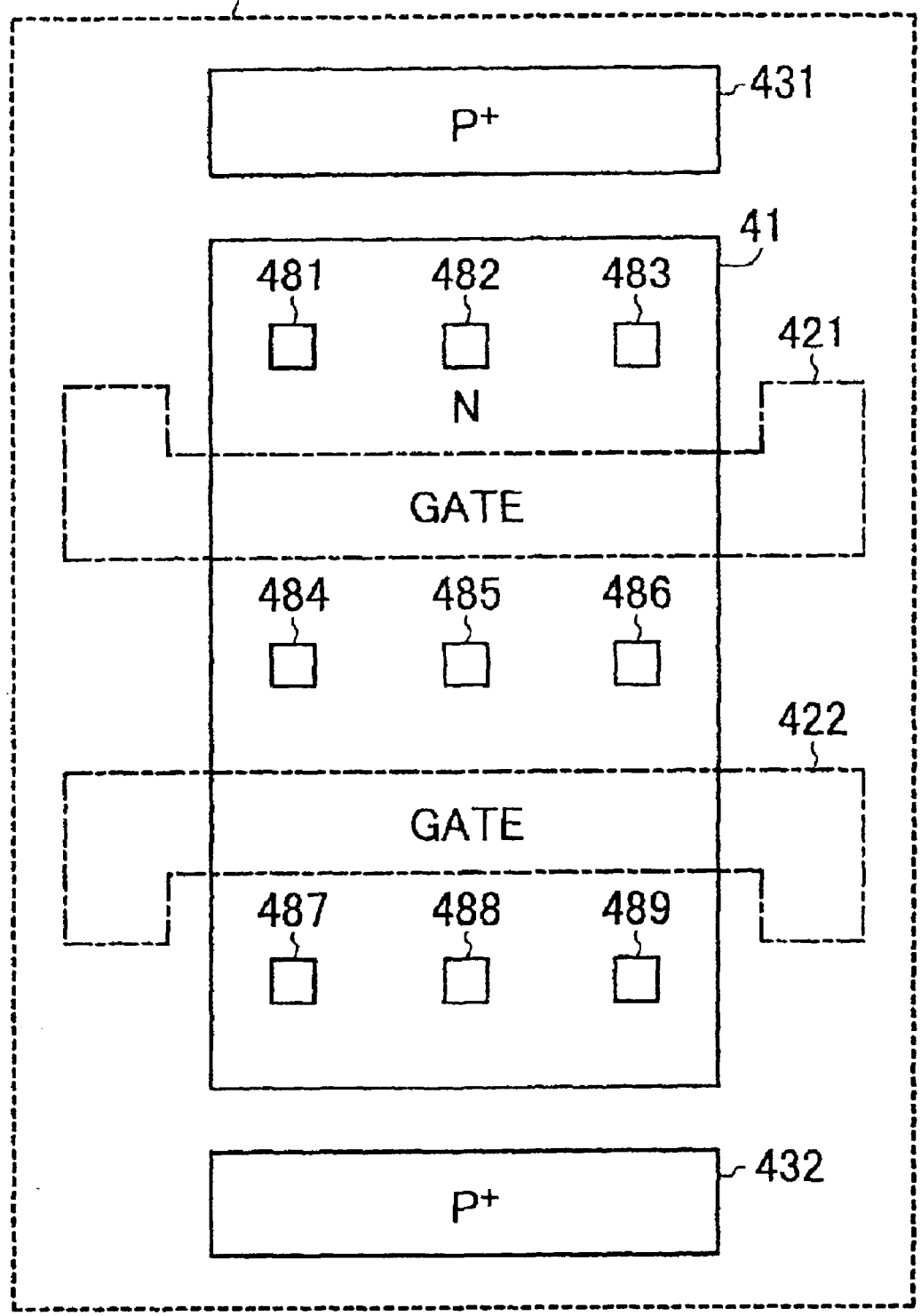
FIG. 7 is a plan view showing a layout of a basic cell with a full contact hole pattern arranged over a pattern of an N-type region.

FIG. 7 shows a layout for a mask to form the basic cell 30.

An N-type region pattern 41 is a rectangular area including the N-type regions 311 to 313 of FIG. 5. Gate patterns 421 and 422 and P⁺-type region patterns 431 and 432 are used for formation of the gates 321 and 322 and the P⁺-type regions 331 and 332. Contact hole patterns 481 to 489 constitutes a full contact hole pattern to be able to arrange over the N-type region pattern 41, the contact holes are used for connection between the N-type regions 311 to 313 and metal lines (not shown) above the impurity regions, and the central points of the patterns are respectively aligned with, for example, grid points (not shown).

Figure 8:
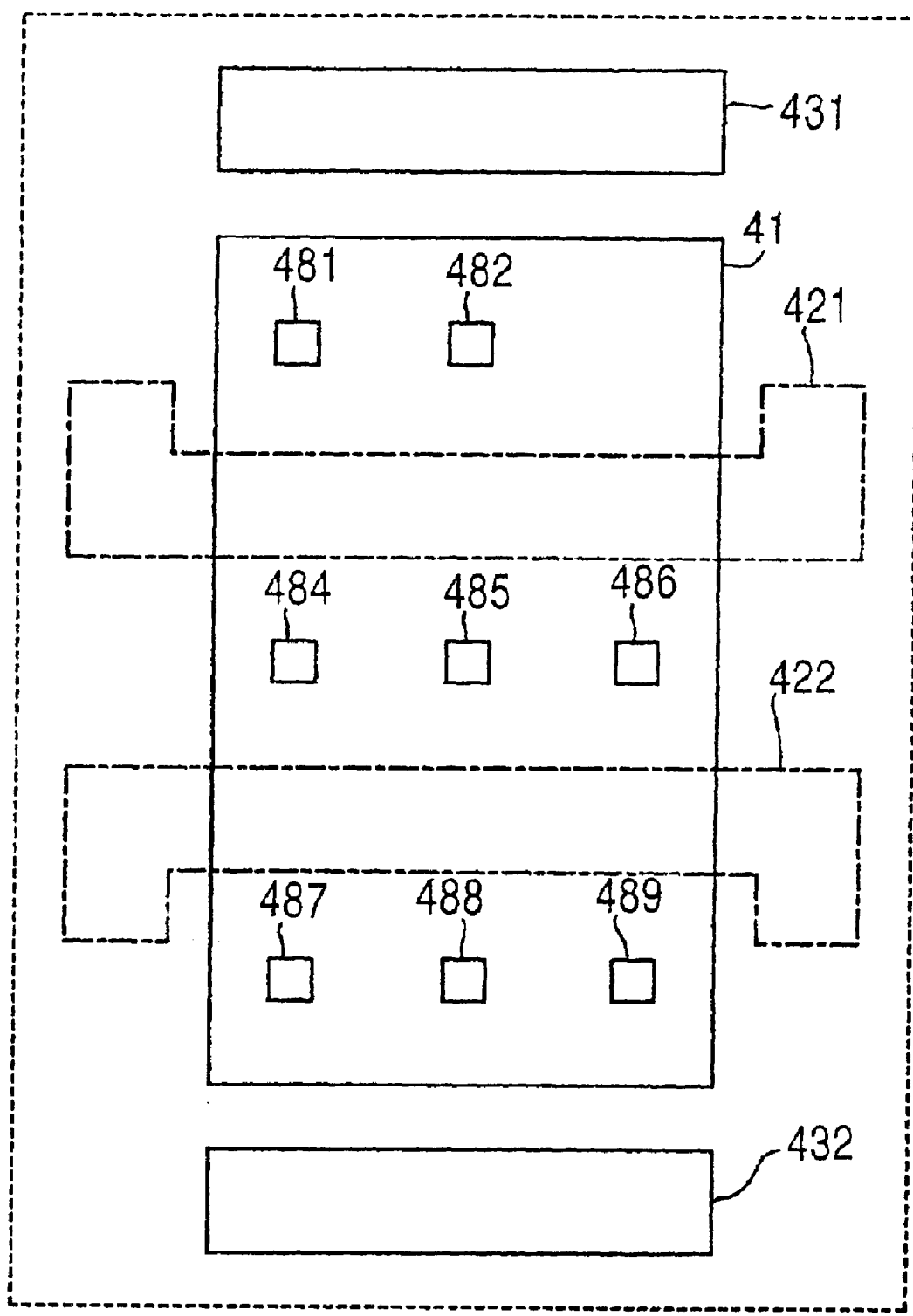
FIG. 8 is a plan view showing a layout pattern of a basic cell with a full contact hole pattern, partly missing, arranged over a pattern of an N-type region.

In a layout pattern as shown in FIG. 8, when a contact hole pattern is partly missing on the N-type region pattern 41 in comparison with FIG. 7 (when a contact hole is not existent at a position where the contact hole can be existent), a useless area is existent in the N-type region pattern 41. This non-use area is an object to be removed.

(S5) A mask with a modified pattern is prepared.

(S6) The mask is substituted for a mask before modification in a mass manufacturing stage, thereby semiconductor integrated circuits from which non-use areas are removed are manufactured.

Then, details of processing of the step S4 will be described only in case where a non-use area of an N-type region of an NMOS transistor is removed.

FIG. 2 is a functional block diagram, and blocks 10a to 10c in a computer 10 show contents to be processed on programs. A storage device 11 connected to the computer 10 is, for example, a hard disk, which includes pattern data storage areas 12 to 16 and 16R.

(10a) Generation of a Removal Pattern

A removal pattern generation block 10a generates a removal pattern data from contact hole pattern data in the storage area 12 and segmentation pattern data and cell arrangement information in the storage area 13, and stores the removal pattern data in the storage area 14.

Figure 11:
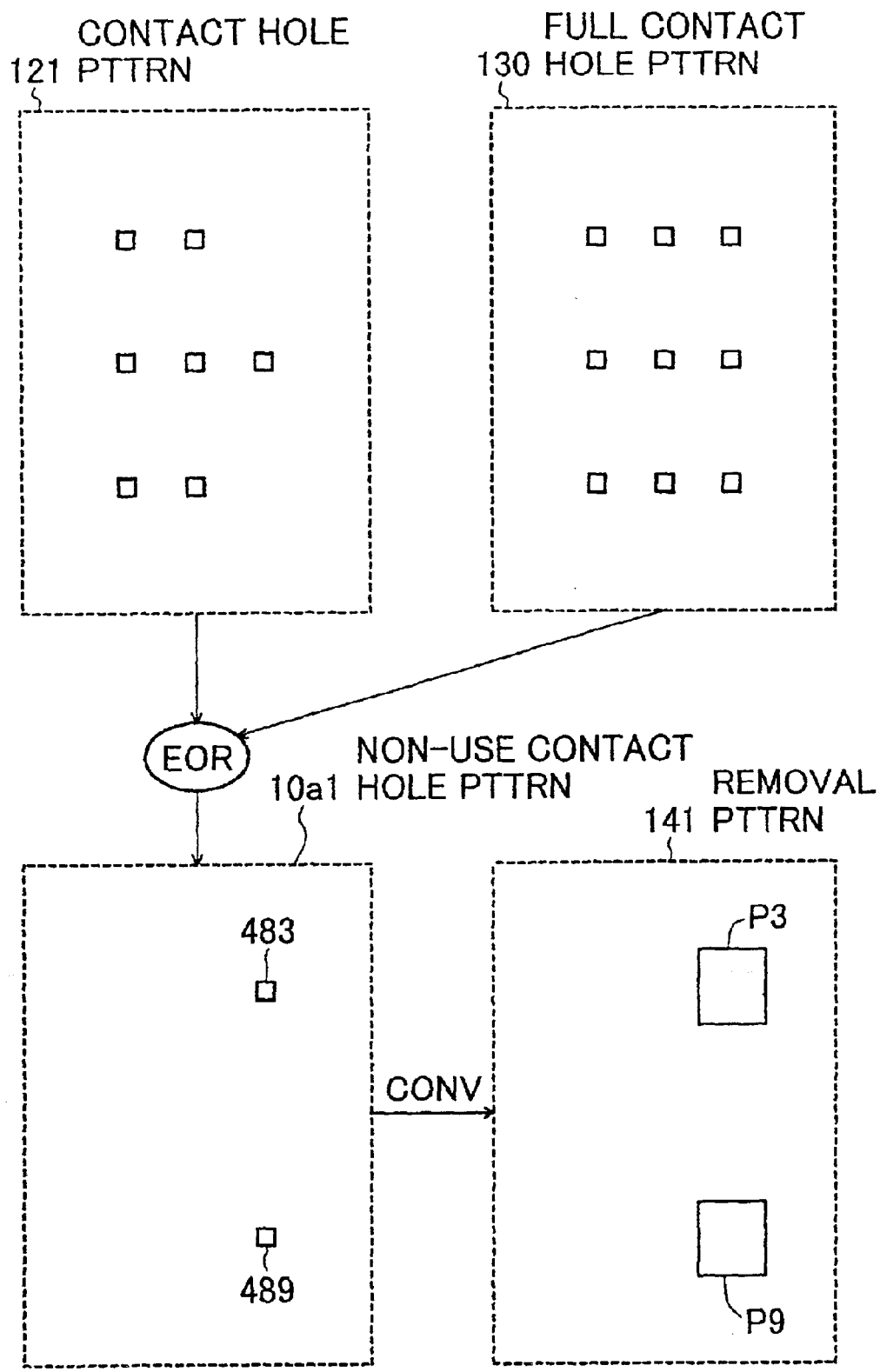
FIG. 11 is an illustration of processing in the removal pattern generation block of FIG. 2.

In the storage area 12, there are stored contact hole pattern data, for example, data of contact hole pattern 121 in FIG. 11 corresponding with FIG. 8, for connecting metal lines to N-type regions of transistors in the embedded array 21.

Figure 10:
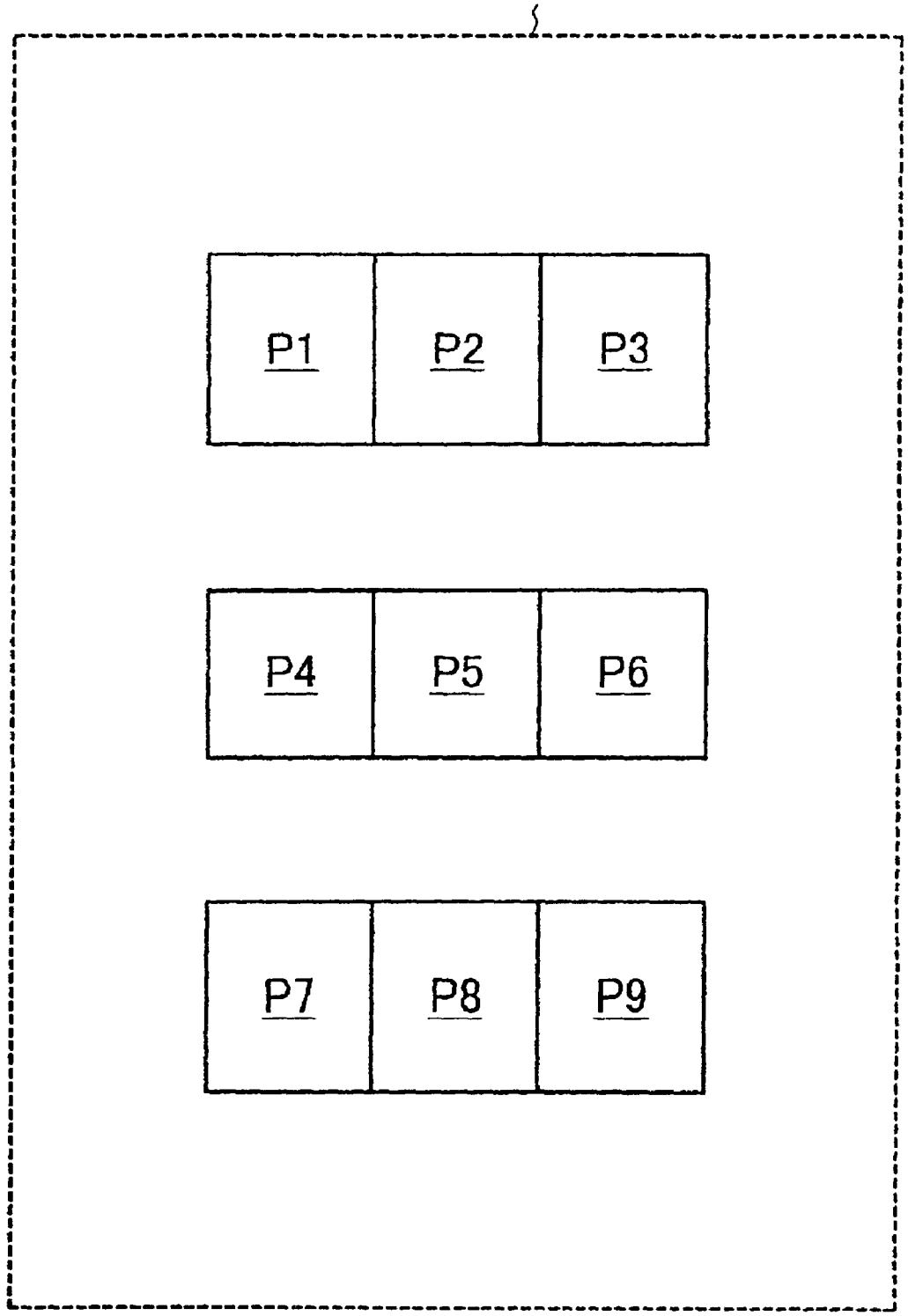
FIG. 10 is a plan view showing a full segmentation pattern corresponding with a full contact hole pattern of FIG. 7.

In the storage area 13, there are stored data of a full contact hole pattern 130 in FIG. 11 which corresponds FIG. 7, data of a full segmentation pattern 131 shown in FIG. 10 which corresponds with the pattern 130 and information on arrangement of a basic cell shown in FIG. 4, for example, coordinates of a cell located at the bottom left corner, a cell pitch and the number of cells in the X direction and a cell pitch and the number of cells in the Y direction.

Figure 9:
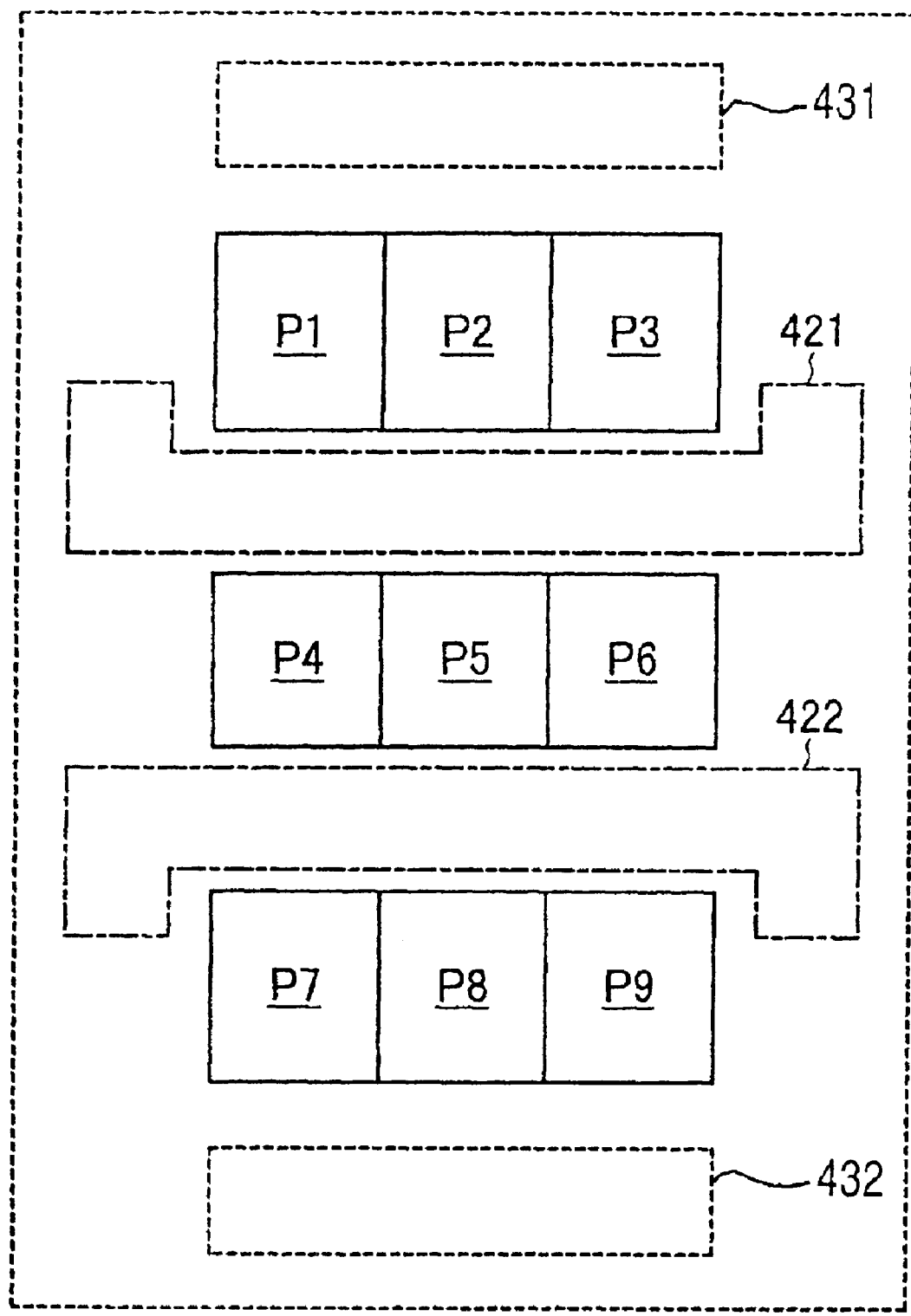
FIG. 9 is a plan view showing a full segmentation pattern each as a removal unit of an N-type region and a positional relation thereof with other patterns.

FIG. 9 is a plan view of superposition of the full segmentation pattern 131 on a pattern which is obtained by removing individual contact hole patterns 481 to 498 of FIG. 7 from the basic cell pattern 40 of FIG. 7 in order to show positions and sizes of the individual segmentation pattern P1 to P9 of FIG. 10. The segmentation patterns P1 to P9 corresponds with the contact hole patterns 481 to 489 of FIG. 7, respectively, and are obtained by segmenting an area which is left after the gate patterns 421 and 422 and its peripheral areas are removed from the N-type region pattern 41. Each of the patterns P1 to P9 is a removal unite from the N-type region pattern.

The removal pattern generation block 10a of FIG. 2 performs, for example, processing as shown in FIG. 11. That is, a non-use contact hole pattern 10a1 is generated from operation of an exclusive OR of a contact hole pattern 121 in the storage area 12 with the full contact hole pattern 130 in the storage area 13. For example, an area within an individual contact hole has '1' and the outside thereof has '0.' The non-use contact hole pattern 10a1 is a missing pattern in the contact hole pattern 121. The removal pattern generation block 10a transforms the individual hole patterns 483 and 489 in the non-use contact hole pattern 10a1 into the corresponding individual segmentation patterns P3 and P9 of FIG. 10 to generate a removal pattern 141, and then the removal pattern 141 is stored in the storage area 14. The removal pattern generation block 10a repeatedly performs such processing on all the basic cells in the embedded array 21.

(10b) Removal Pattern Synthesizing

A removal pattern synthesizing block 10b generates a removal pattern which is part of an N-type region pattern and which is a synthesized result of removal pattern data in the storage area 14 and gate pattern data in the storage area 15.

Figure 12:
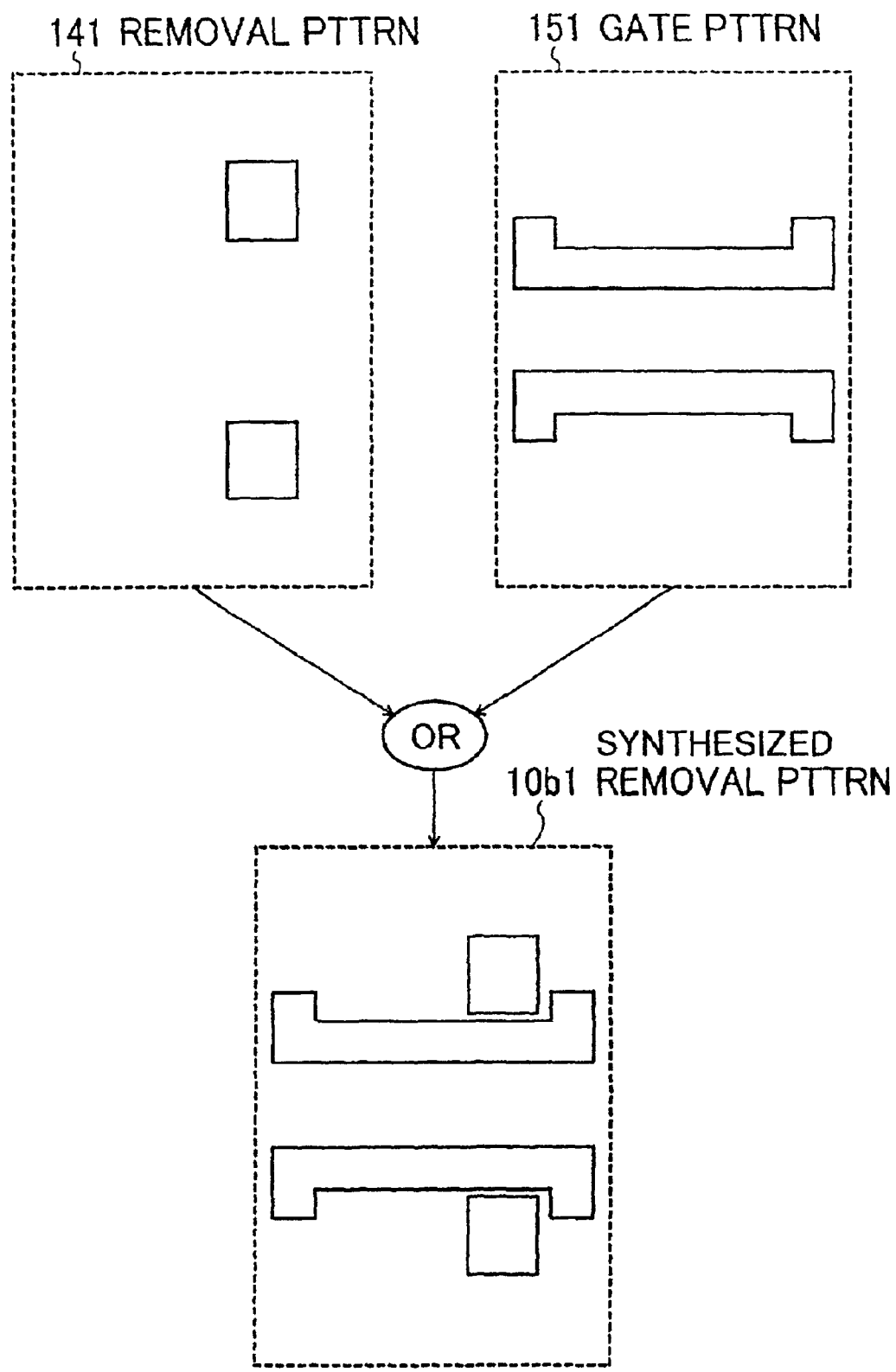
FIG. 12 is an illustration of processing in the removal pattern synthesizing block of FIG. 2.

In the storage area 15, there are stored a gate pattern 151 in FIG. 12, having the gate patterns 421 and 422 in FIG. 7. The removal pattern synthesizing block 10b performs an OR of a removal pattern with a gate pattern. For example in FIG. 12, a synthesized removal pattern 10b1 is generated by operation of an OR of the gate pattern 151 in the storage area 15 with the removal pattern 141 in the storage area 14.

(10c) Pattern Modification

A pattern modification block 10c modifies impurity region pattern data in the storage area 16 by performing an exclusive OR of a pattern generated in the removal pattern synthesizing block 10b with an impurity region pattern in the storage area 16, and stores the modified impurity region pattern data in the storage area 16R.

Figure 13:
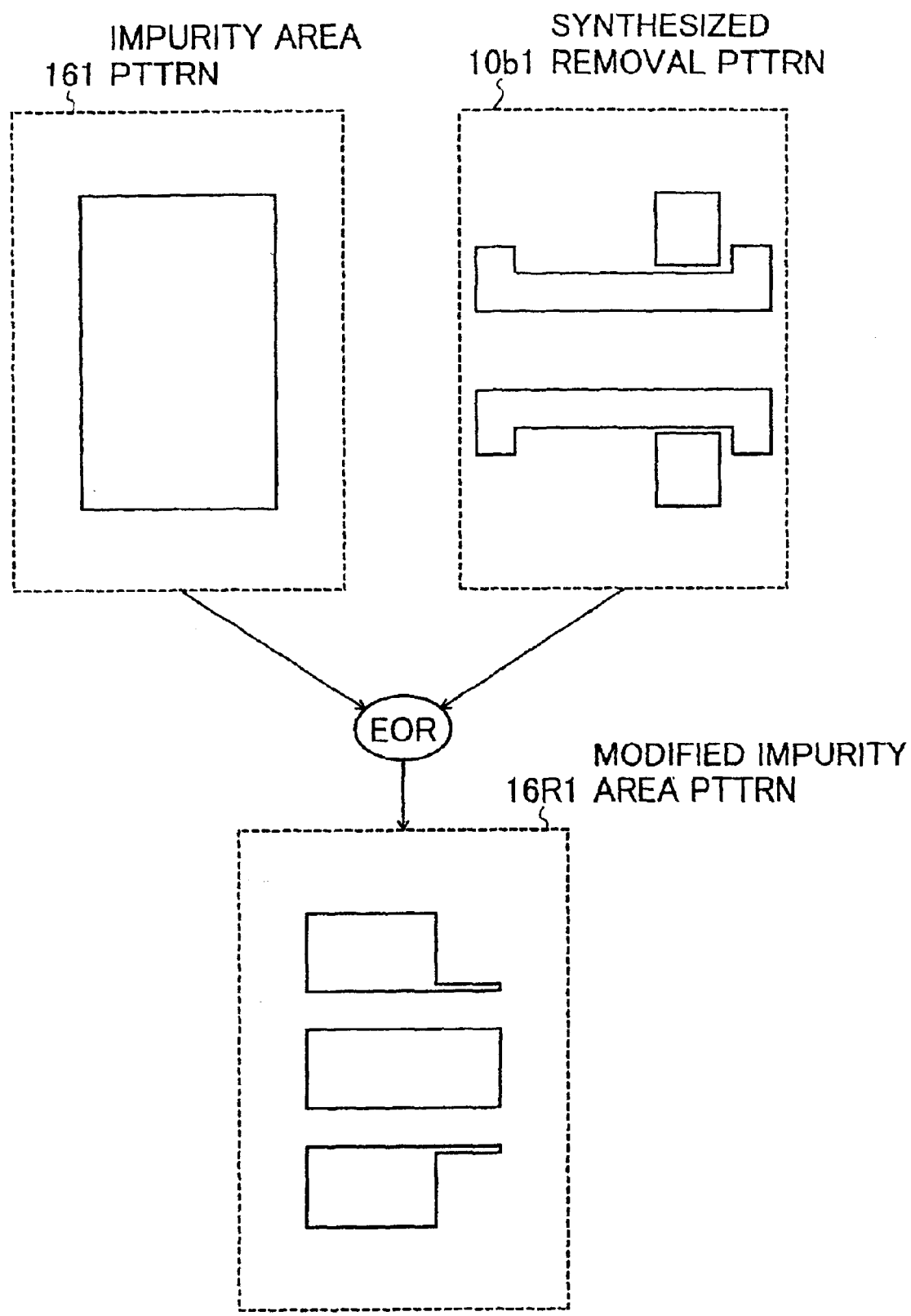
FIG. 13 is an illustration of processing in the pattern correction block of FIG. 2.

For example, as shown in FIG. 13, an exclusive OR of the synthesized removal pattern 10b1 generated in the removal pattern synthesizing block 10b with an impurity region pattern 161 in the storage area 16 is performed to generate an modified impurity region pattern 16R1.

Thereby, the N-type region pattern 16R1, without non-use portion and regions under gate pattern, is obtained.

Since thin part of a gate side N-type region is left even when part of an N-type region is removed, an influence on a performance of the other transistors is decreased.

In the above step S5, an N-type region mask is generated based on data which is stored in the impurity region pattern data storage area 16R. A contact hole pattern mask and a gate pattern mask which are used in the above step S6 are same as in a prior art ones.

Since a non-use area of an N-type region is removed in a circuit formed on a semiconductor substrate with using such a mask, capacitance of the N-type region and parasitic capacitance between the N-type region and lines thereover are decreased from those of prior art. Thereby, not only power consumption is reduced, but also a signal propagation delay time is shorter and an operating speed of transistors is improved.

What is required in a mass manufacturing stage is to replace a N-type region mask by a modified N-type region mask, an extension of a development period due to this replacement is a little.

Second Embodiment

Figure 14:
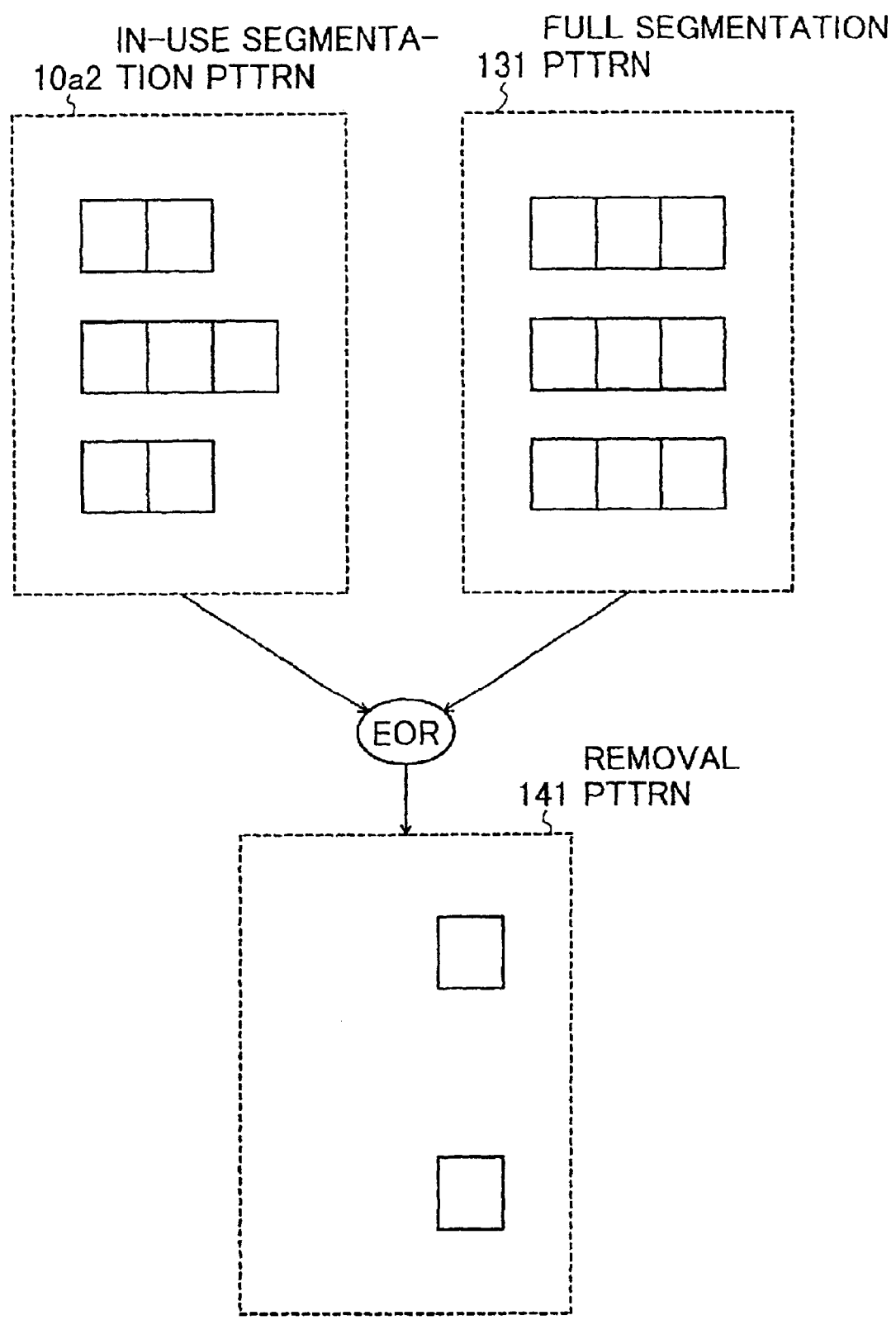
FIG. 14 is an illustration of processing of removal pattern generation corresponding with FIG. 11, of a second embodiment in accordance with the present invention.

FIG. 14 is an illustration of processing of removal pattern generation corresponding with FIG. 11, in the second embodiment in accordance with the present invention.

In this embodiment, in the removal pattern generation block 10a, for example, the contact hole pattern 121 of FIG. 11 is transformed to an in-use segmentation pattern 10a2 of FIG. 14. An exclusive OR of the in-use segmentation pattern 10a2 with the full segmentation pattern 131 is performed to obtain a removal pattern 141.

The other points are same as in the first embodiment.

Third Embodiment

Figure 15:
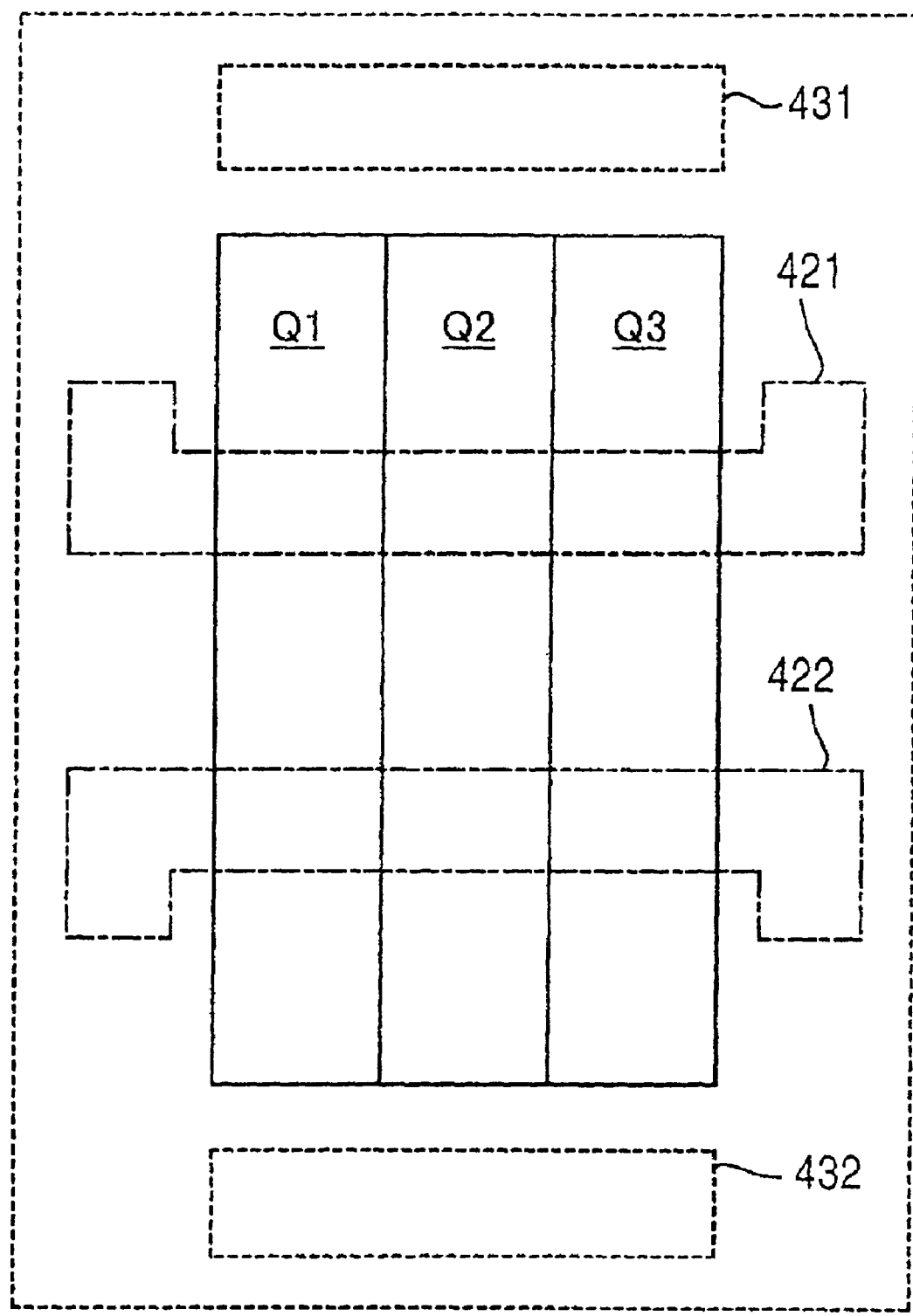
FIG. 15 is a plan view showing a segmentation pattern corresponding with FIG. 9, of a third embodiment in accordance with the present invention.

FIG. 15 shows a segmentation pattern which corresponds with FIG. 9, of the third embodiment in accordance with the present invention.

In this embodiment, instead of the individual patterns P1 to P9 of FIG. 9, there are provided a segmentation pattern Q1 having segmentation patterns P1, P4 and P7, a segmentation pattern Q2 having segmentation patterns P2, P5 and P8 and a segmentation pattern Q3 having segmentation patterns P3, P6 and P9. The segmentation patterns Q1, Q2 or Q3 are applied to cases where all the three individual contact hole patterns in line are missing.

Figure 16:
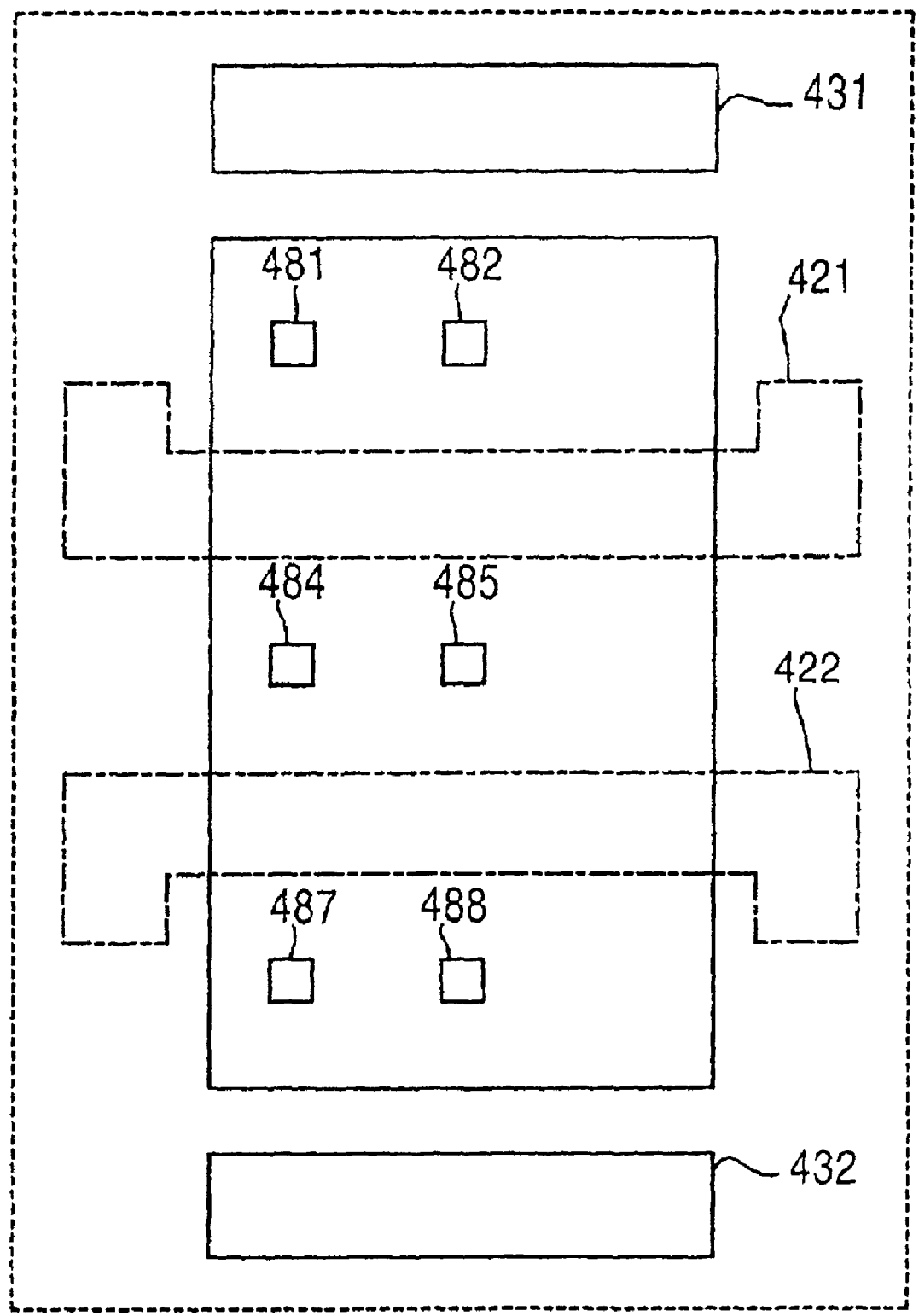
FIG. 16 is a plan view showing a basic cell layout pattern as an object to be processed on which an effective result is obtainable in the third embodiment, corresponding with FIG. 8.

FIG. 16, corresponding with FIG. 8, is a diagram showing a layout pattern as an object to be processed on which an effective result is obtainable in this third embodiment.

Figure 17:
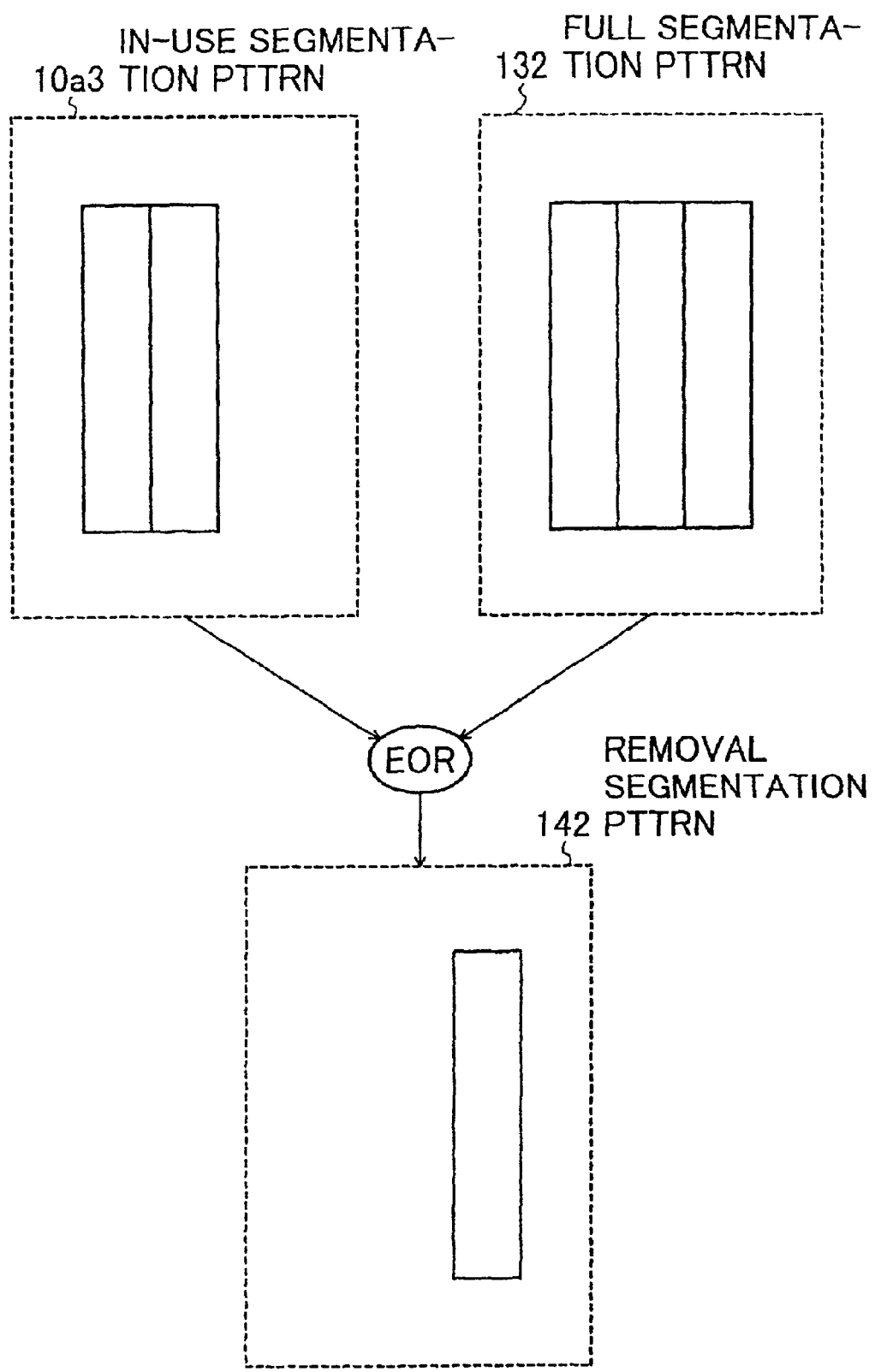
FIG. 17 is an illustration of processing of removal pattern generation corresponding with FIG. 14, in the third embodiment.

Since the contact holes in line corresponding with the segmentation pattern Q3 are missing, processing shown in FIG. 17 is performed in the removal pattern generation block 10a of FIG. 2. That is, an exclusive OR is performed between a full segmentation pattern 132 corresponding with FIG. 15 and a in-use segmentation pattern 10a3 corresponding with FIG. 16, whereby a removal segmentation pattern 142 is generated.

Figure 18:
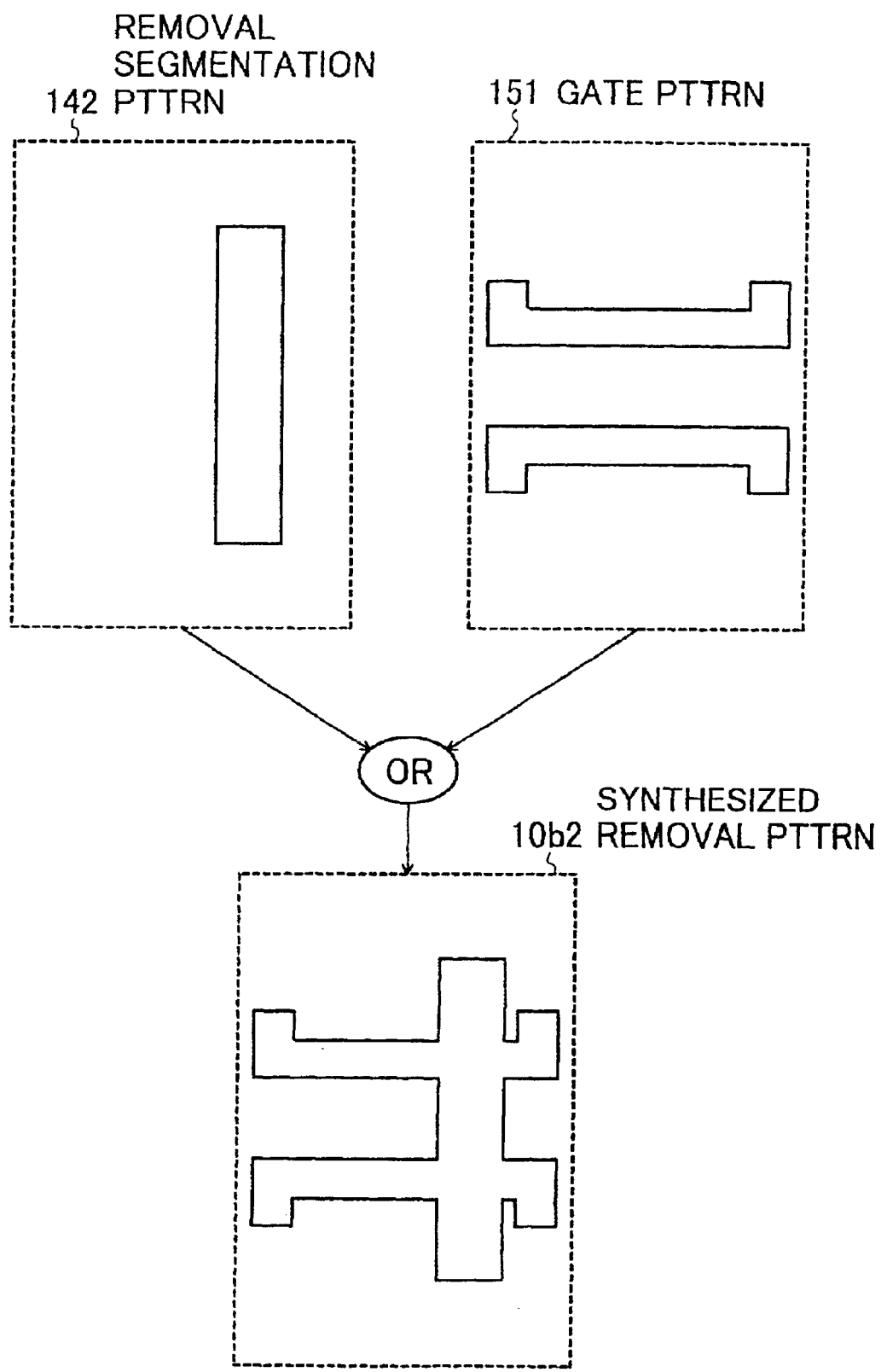
FIG. 18 is an illustration of processing of removal pattern synthesis corresponding with FIG. 12, in the third embodiment.
Figure 19:
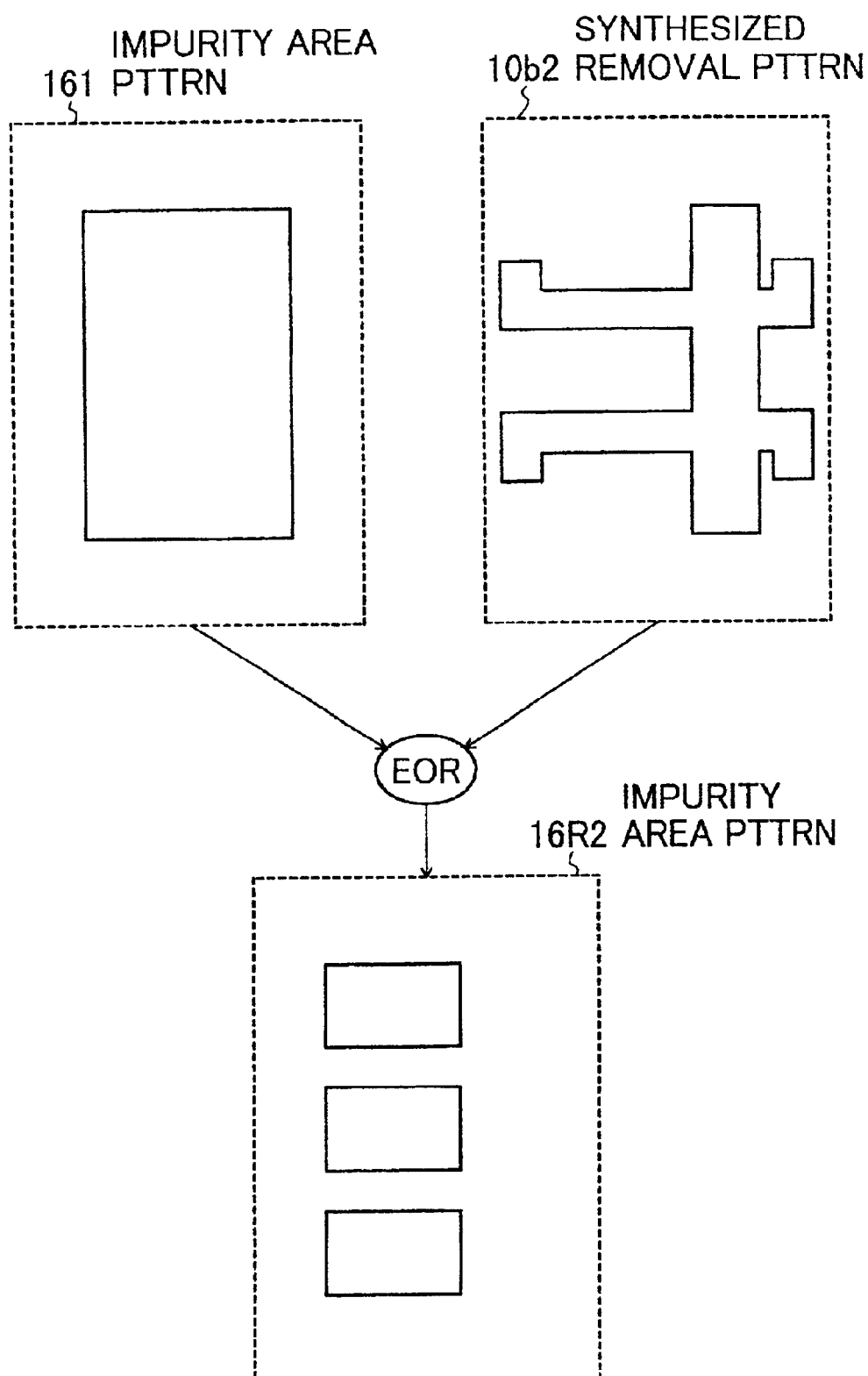
FIG. 19 is an illustration of processing of pattern correction corresponding with FIG. 13, in the third embodiment.

In the removal pattern synthesizing block 10b of FIG. 2, for example as shown in FIG. 18, an OR is performed between a gate pattern 151 in the storage area 15 and a removal pattern 142 in the storage area 14, and thereby a synthesized removal pattern 10b2 is generated. Further, in the pattern modification block 10c of FIG. 2, for example as in FIG. 19, an exclusive OR is performed between the synthesized removal pattern 10b2 and an impurity region pattern 161 in the storage area 16, and thereby an impurity region pattern 16R2 is generated.

The other points are same as those in the first embodiment.

According to the third embodiment, since, when one line of contact hole patterns is missing, a corresponding area in an impurity region pattern is completely removed, capacitance of the impurity region and parasitic capacitance between the impurity region and metal lines thereover can be reduced more those of the first embodiment in which parts of the impurity region in the vicinity of gates are left.

However, when one or two in one line of contact hole patterns are missing, part of an impurity region pattern is not removed.

Therefore, if processing in the third embodiment is followed by processing in the first embodiment, since the non-use impurity region pattern area is removed, a more effective result is obtained.

Figure 20:
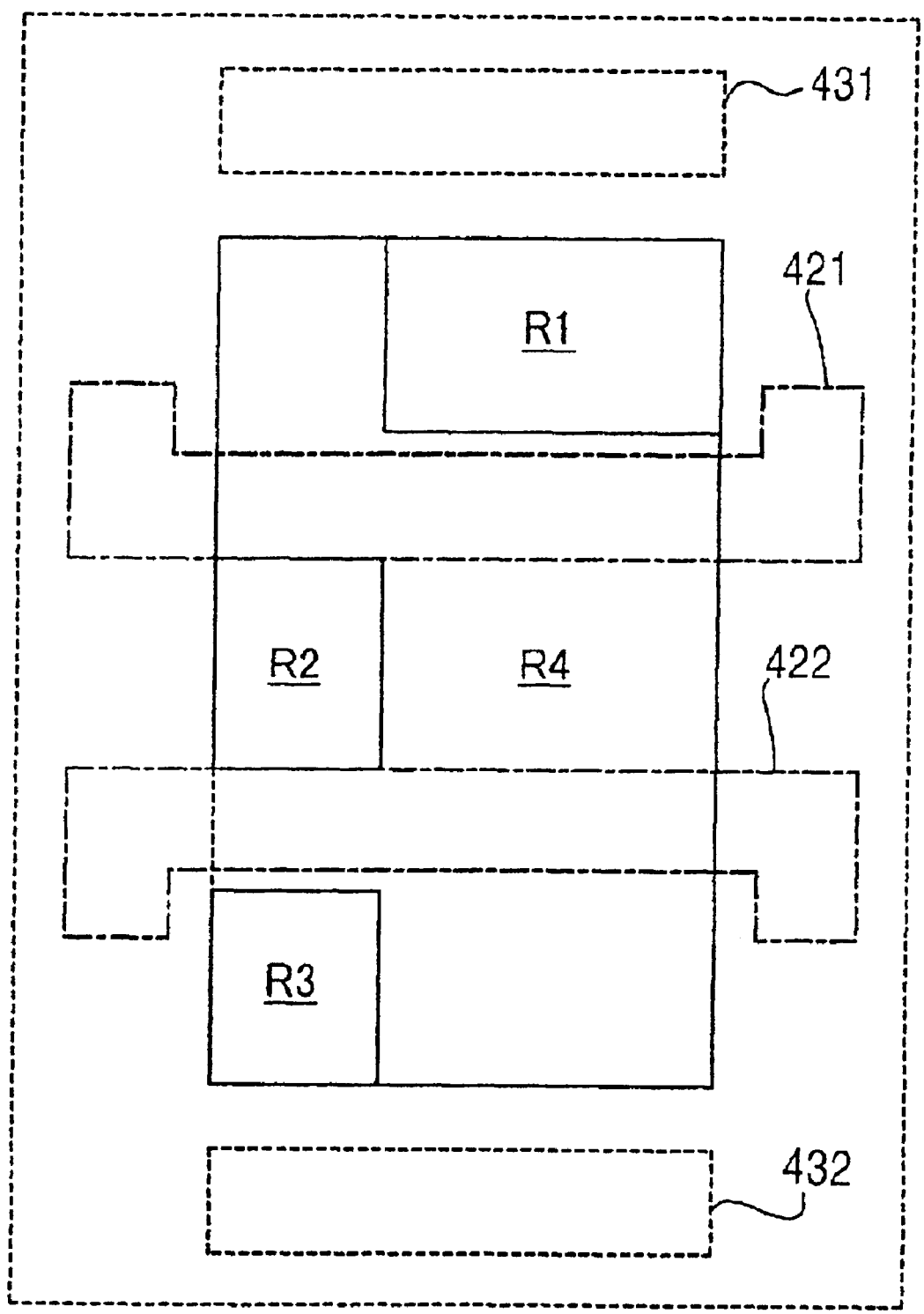
FIG. 20 is a plan view showing another segmentation pattern each as a removal unit of an N-type region.

It should be noted that a variety of segmentation patterns for a transistor impurity region is conceived, and FIG. 20 shows another shape of a segmentation pattern. This figure corresponds with FIG. 15, and patterns R1 to R4 are all individual segmentations.

Fourth Embodiment

As the fourth embodiment in accordance with the present invention, details of the step S4 of FIG. 1 will be described only in a case where a non-use area of a $P^+$-type region pattern in FIG. 6 is removed.

Figure 22:
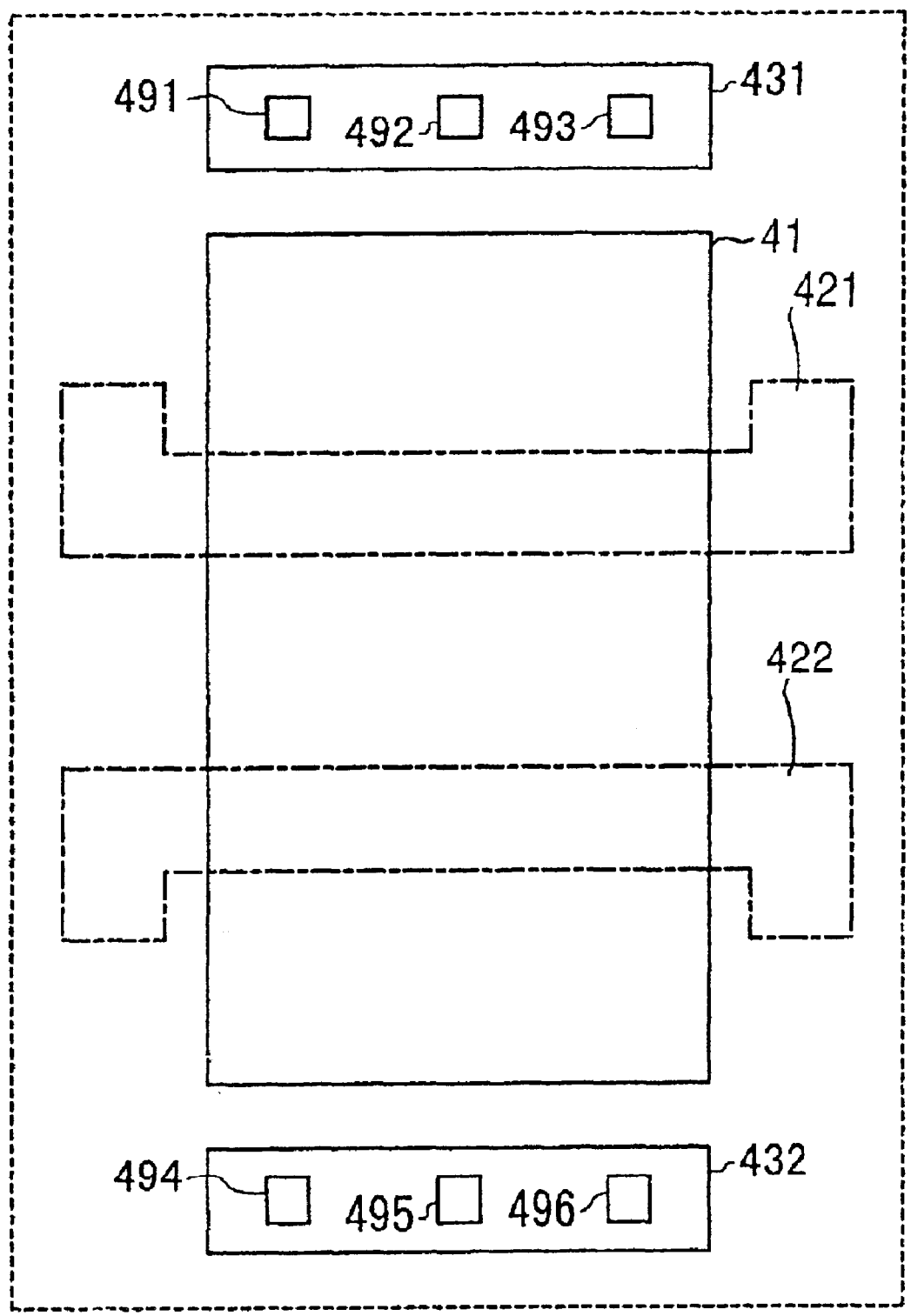
FIG. 22 is a plan view showing a layout pattern of a basic cell with a full contact hole pattern arranged over a pattern of a P⁺-type region for applying a bias potential to a substrate.

Individual contact hole patterns 491 to 493 shown in FIG. 22 are used for connection between a $P^+$-type region 431 and a metal line (not shown) having a ground potential. Likewise, individual contact hole patterns 494 to 496 are used for connection between a $P^+$-type region 432 and a metal line having a ground potential.

Figure 23:
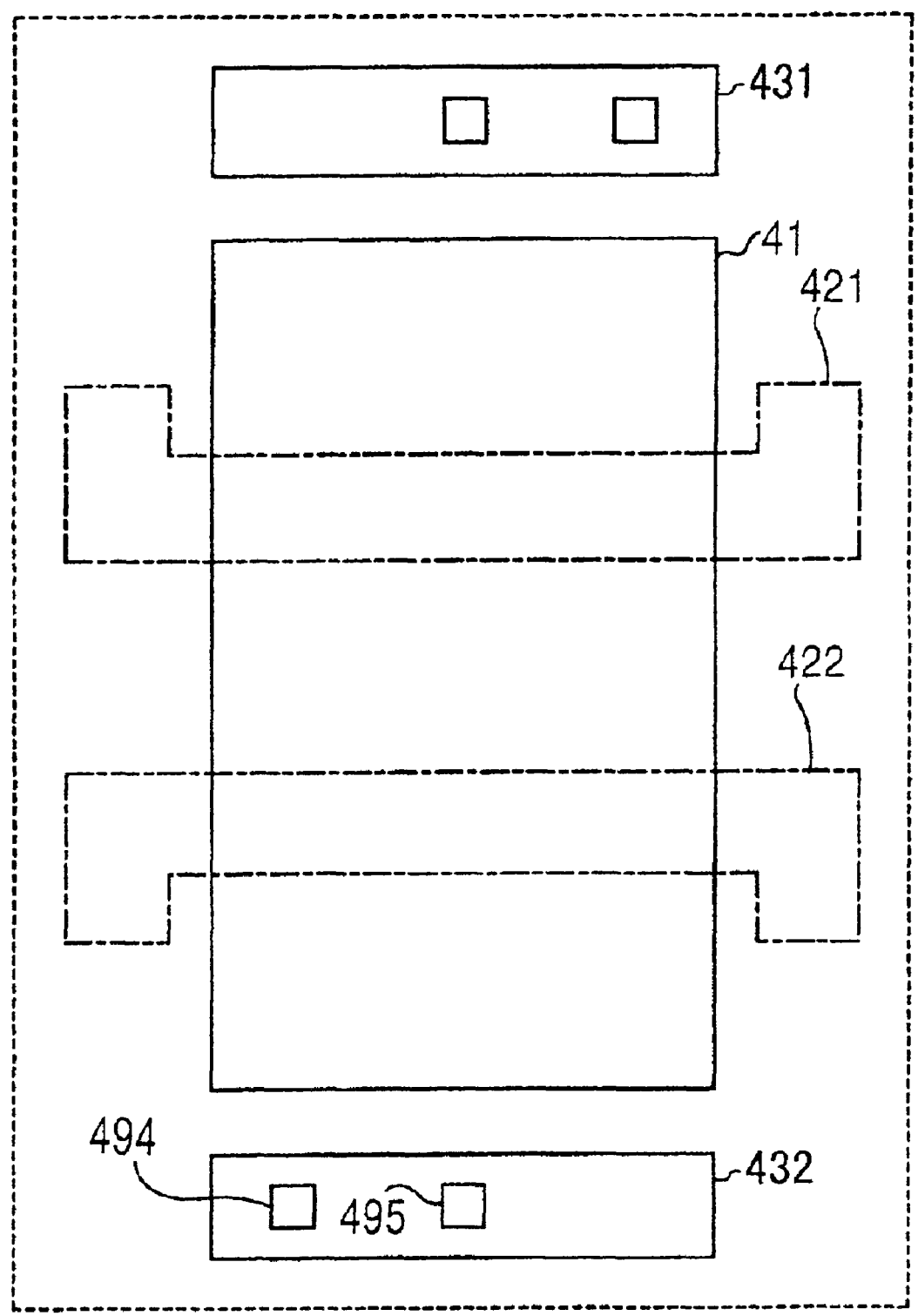
FIG. 23 is a plan view showing a layout pattern of a basic cell with a full contact hole pattern, partly missing, arranged over the P⁺-type region pattern.

When the individual contact hole patterns 491 and 496 are missing on the $P^+$-type region patterns 431 and 432, respectively, as shown in FIG. 23 in a layout pattern, non-use areas which are useless remain in the $P^+$-type region patterns 431 and 432. The non-use areas are objects of removal in this fourth embodiment.

Figure 21:
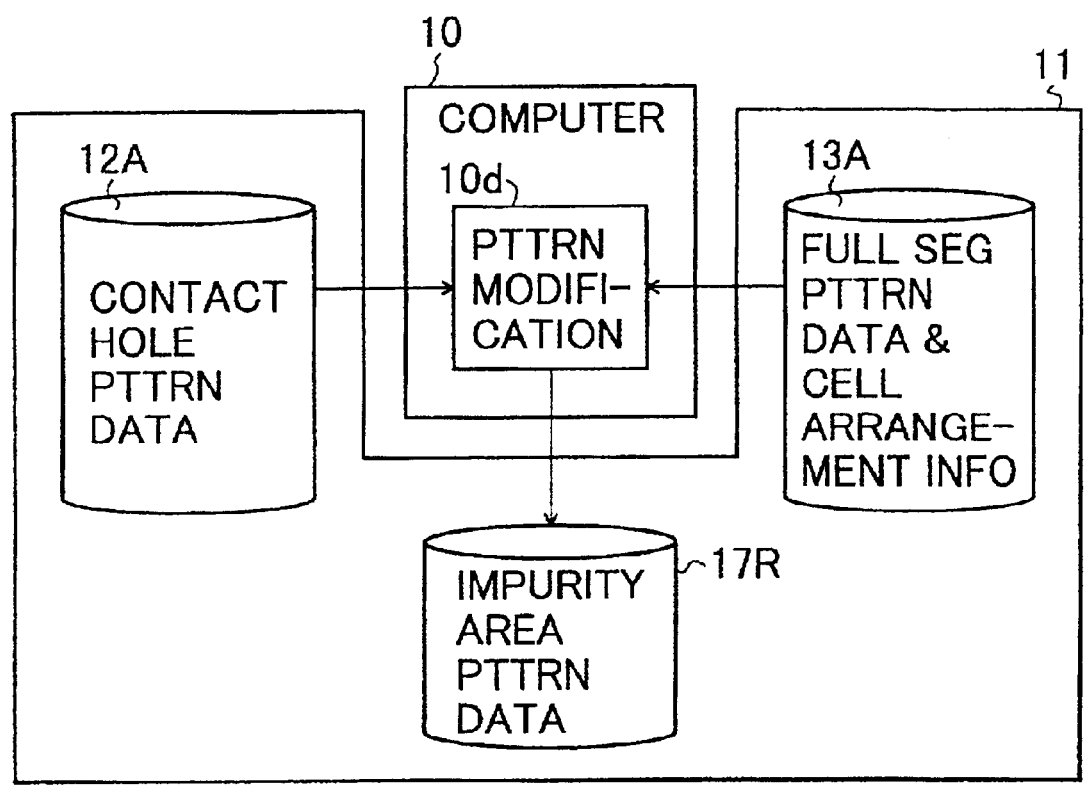
FIG. 21 is a functional block diagram showing an apparatus for performing step S4 of FIG. 1, in a fourth embodiment in accordance with the present invention.

FIG. 21 is a schematic functional block diagram of an apparatus for detecting and removing a non-use area pattern based on contact hole layout data.

In a storage area 12A for contact hole pattern data, there are stored data of a contact hole layout pattern, for example, data of a contact hole pattern in FIG. 23, for connection between a $P^+$-type region in the embedded array 21 and a metal line.

Figure 24:
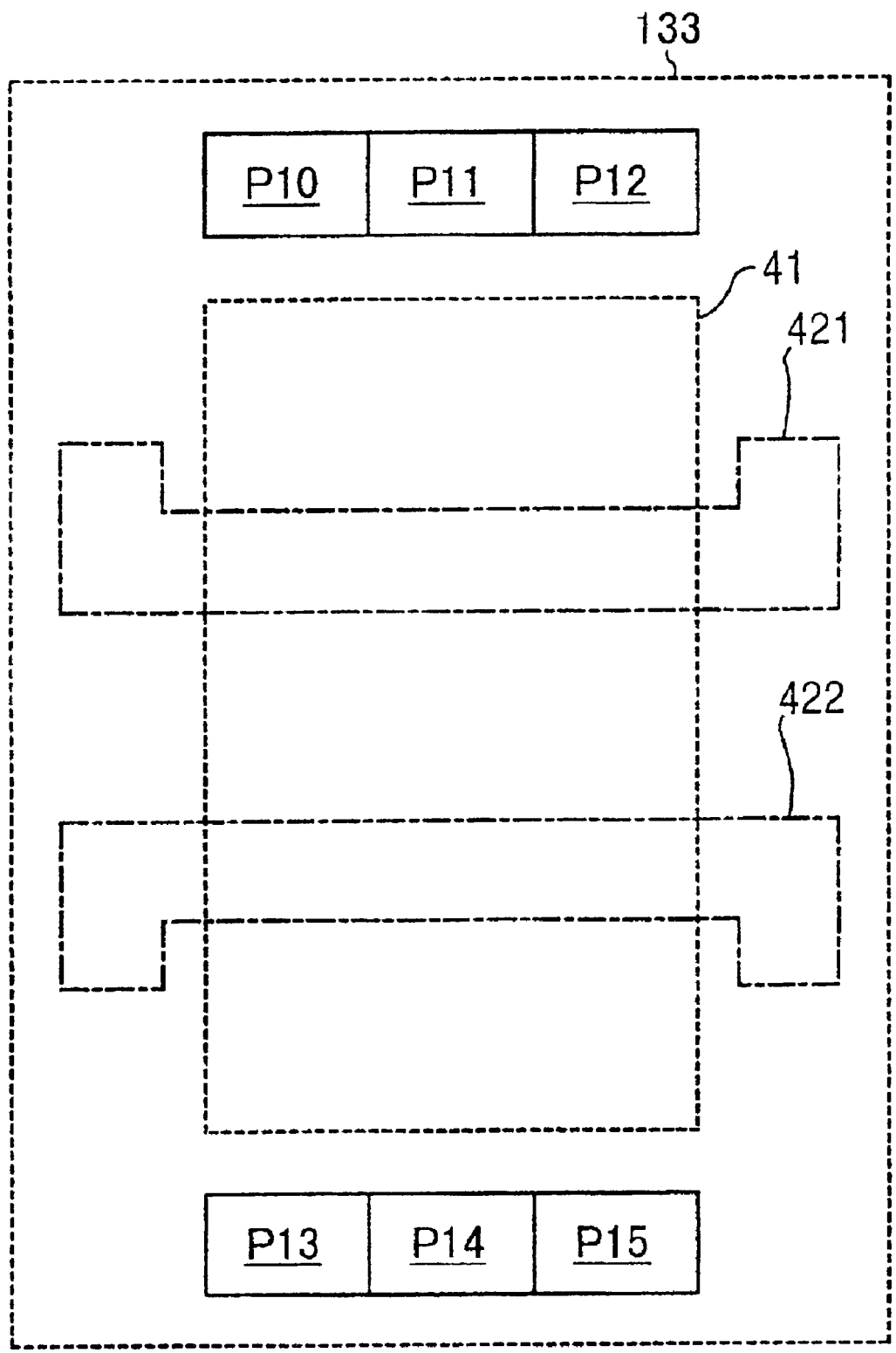
FIG. 24 is a plan view showing full segmentation patterns each as a removal unit of an P⁺-type region and a positional relation thereof with other patterns.

In FIG. 24, corresponding with FIG. 9, individual segmentation patterns P10 to P12 are generated by segmenting a $P^+$-type region pattern 431 of FIG. 22 in a corresponding manner to individual contact hole patterns 491 to 493, and individual segmentation patterns P13 to P15 are generated by segmenting a $P^+$-type region pattern 432 of FIG. 22 in a corresponding manner to individual contact hole patterns 494 to 496. The result of such segmentation is stored in a storage area 13A as a full segmentation pattern 133. The above described information on basic cell arrangement is also stored in the storage area 13A.

A pattern modification block 10d generates modified $P^+$-type region pattern data in which area corresponding to missing contact hole pattern are removed, based on contact hole pattern data in the storage area 12A, and the segmentation pattern data and the basic cell arrangement information in the storage area 13A, and stores data of the modified $P^+$-type region pattern in a storage area 17R.

Figure 25:
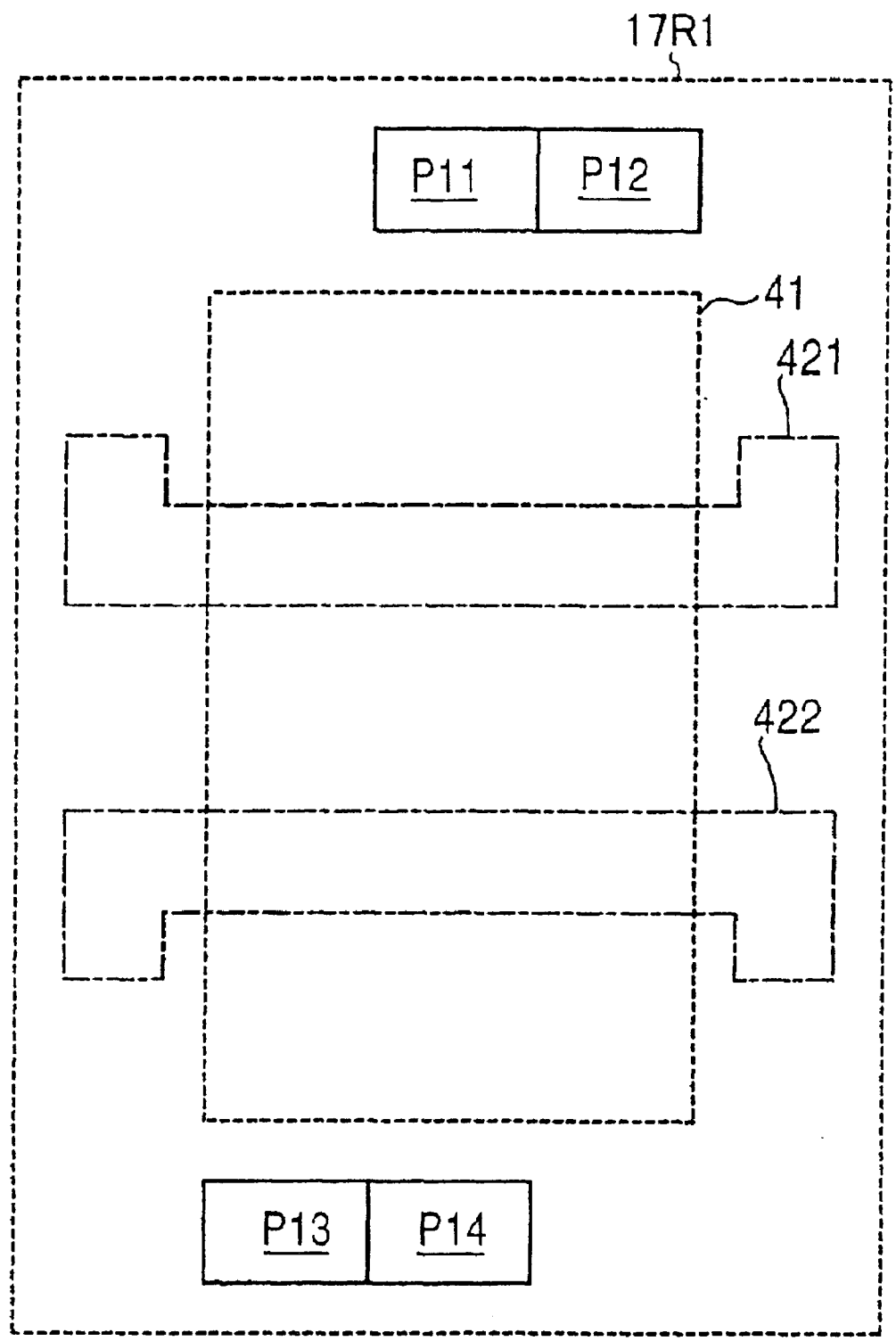
FIG. 25 is a plan view showing P⁺-type region patterns, partly removed in the pattern correction block of FIG. 21.

For example, it is investigated whether or not individual contact hole patterns in FIG. 23 are existent ('1') at the corresponding positions which are central positions of the segmentation patterns P10 to P15 in the full segmentation pattern 133. If existent, corresponding segmentation patterns are marked and an OR pattern of the marked segmentation patterns is obtained as a modified $P^+$-type region pattern 17R1 of FIG. 25. Such processing is repeated on all the basic cells in the embedded array 21.

It should be noted that as in FIG. 2, it is allowed alternatively that a removal pattern which corresponds with a missing contact hole pattern is firstly obtained and secondly, an exclusive OR is performed between the removal pattern and a $P^+$-type region pattern before modification, and the result of the exclusive OR operation is obtained as the modified impurity region pattern 17R1.

In step S5 of FIG. 1, a mask of a $P^+$-type region pattern is generated based on modified impurity region pattern data stored in the storage area 17R.

Since circuit formed on a semiconductor substrate using such a mask has a $P^+$-type region pattern without a non-use area, capacitance between the $P^+$-type region and a line thereover is reduced compared with a prior art case, and thereby a signal propagation delay time of the line is shorter.

Since it is only required that a mask having a modified $P^+$-type region pattern is substituted for a preceding one in a mass manufacturing stage, extension of a development period due to the substitution is a little.

Fifth Embodiment

Next, details of the step S4 of FIG. 1 will be described only in a case where a non-use area of a gate pattern is removed, as the fifth embodiment in accordance with the present invention.

Figure 27:
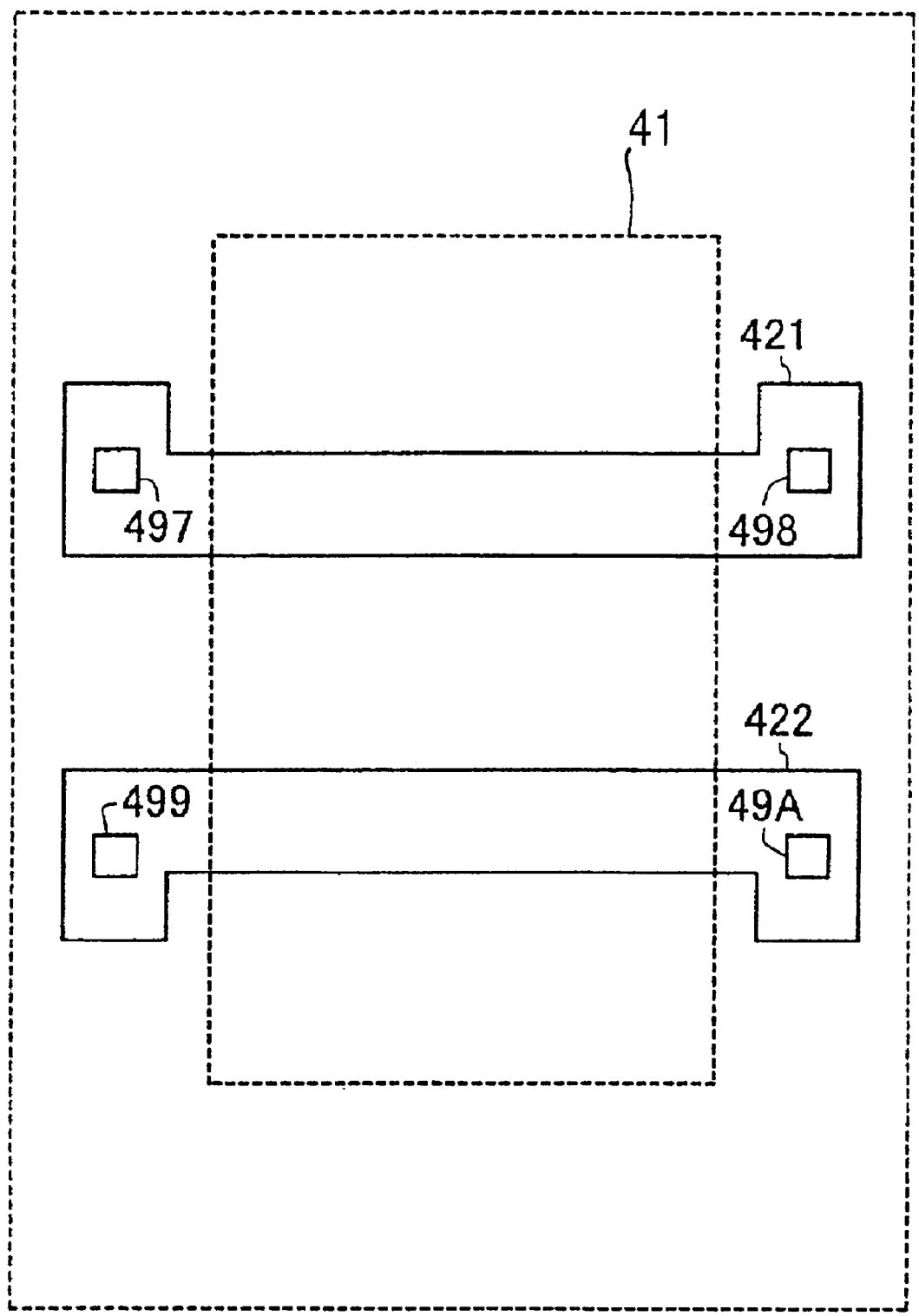
FIG. 27 is a plan view showing a layout of a basic cell with a full contact hole pattern arranged over gate patterns.

Individual contact hole patterns 497 and 498 shown in FIG. 27 are used for connection between the gate 421 and a metal line thereover, not shown, and likewise, individual contact hole patterns 499 and 49A are used for connection between a gate 422 and a metal line thereover, not shown.

Figure 28:
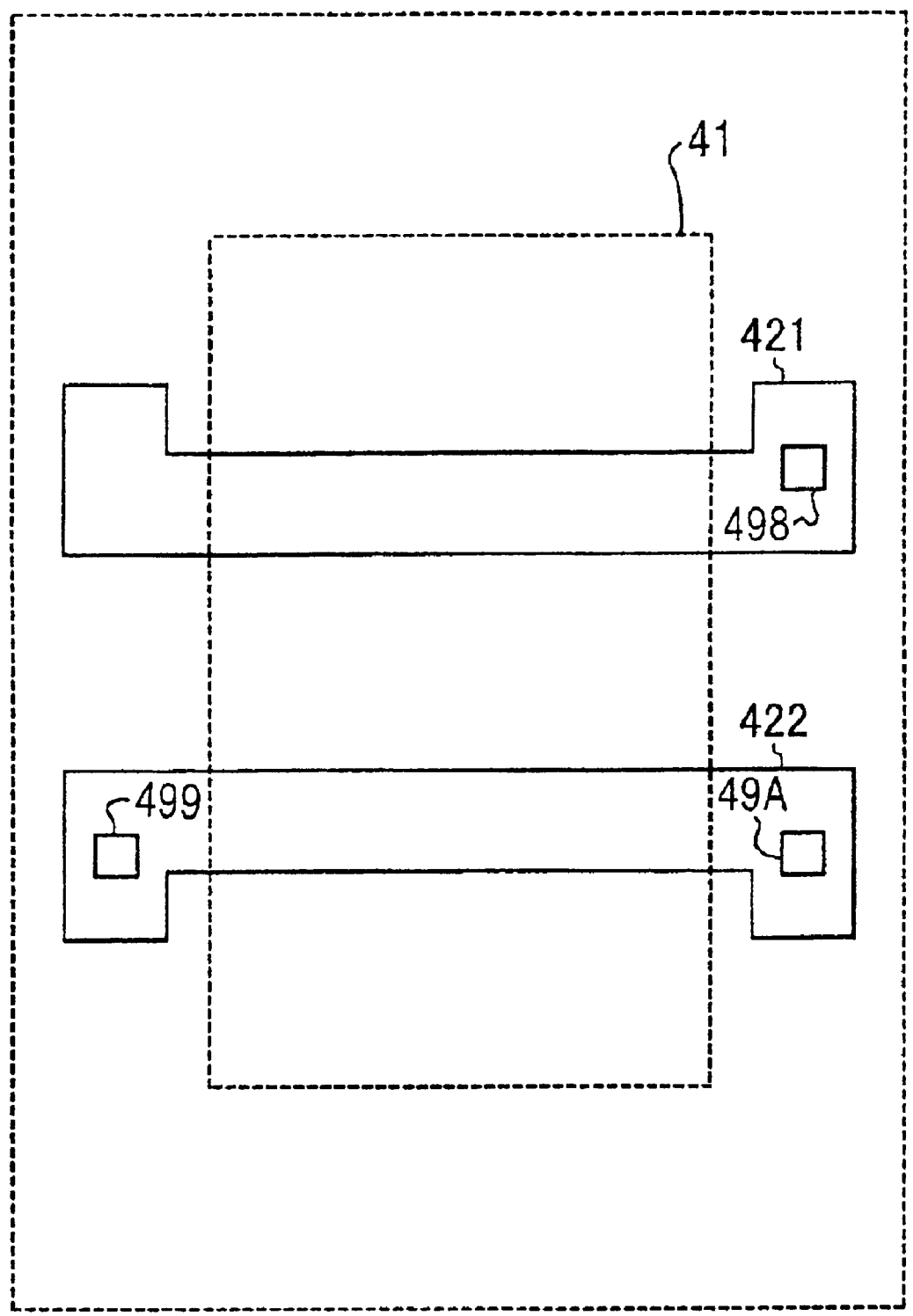
FIG. 28 is a plan view showing a layout pattern of a basic cell with a full contact hole pattern, partly missing, arranged over the gate patterns.

In a case where an individual contact hole pattern is missing on the gate pattern 421 as shown in FIG. 28 in a layout pattern, a non-use area is existent in the gate pattern 421. Such a non-use area is an object to be removed in this fifth embodiment.

Figure 26:
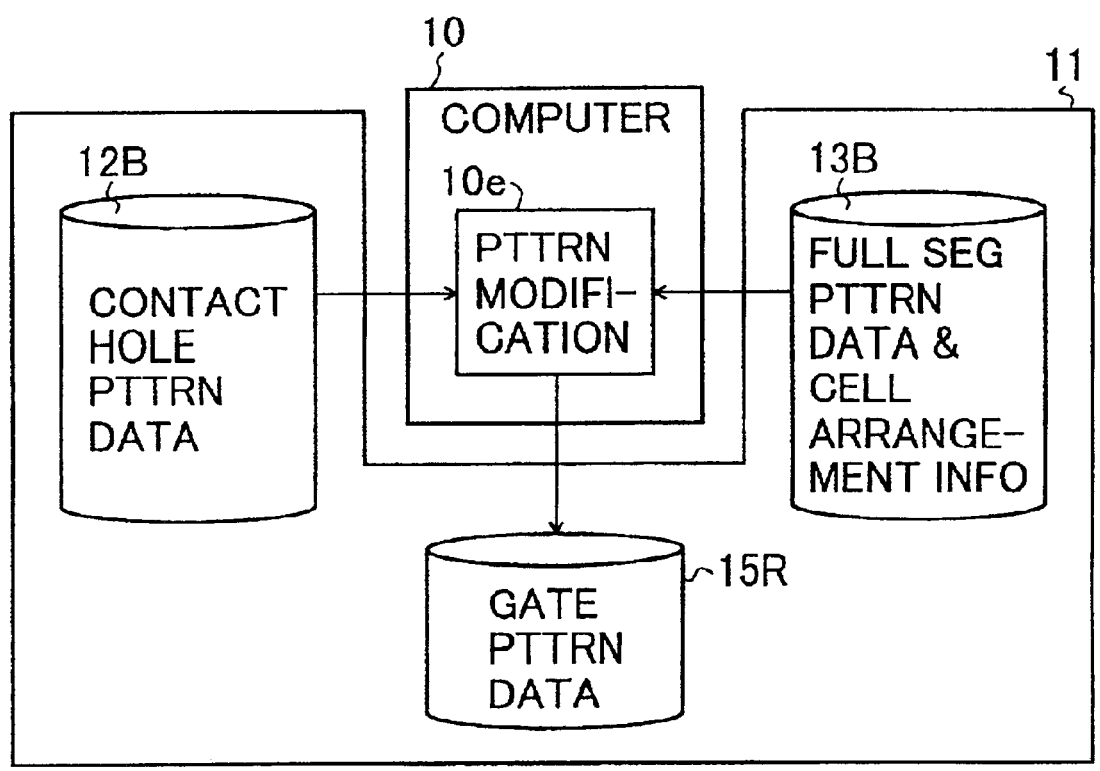
FIG. 26 is a functional block diagram showing an apparatus for performing step S4 of FIG. 1, of a fifth embodiment in accordance with the present invention.

FIG. 26 is a functional block diagram of an apparatus for detecting and removing the non-use area pattern based on layout data of a contact hole.

In a storage area 12B, there are stored contact hole pattern data for connection between gates and metal line in the embedded array 21, for example data of the individual contact hole patterns in FIG. 28.

Figure 29:
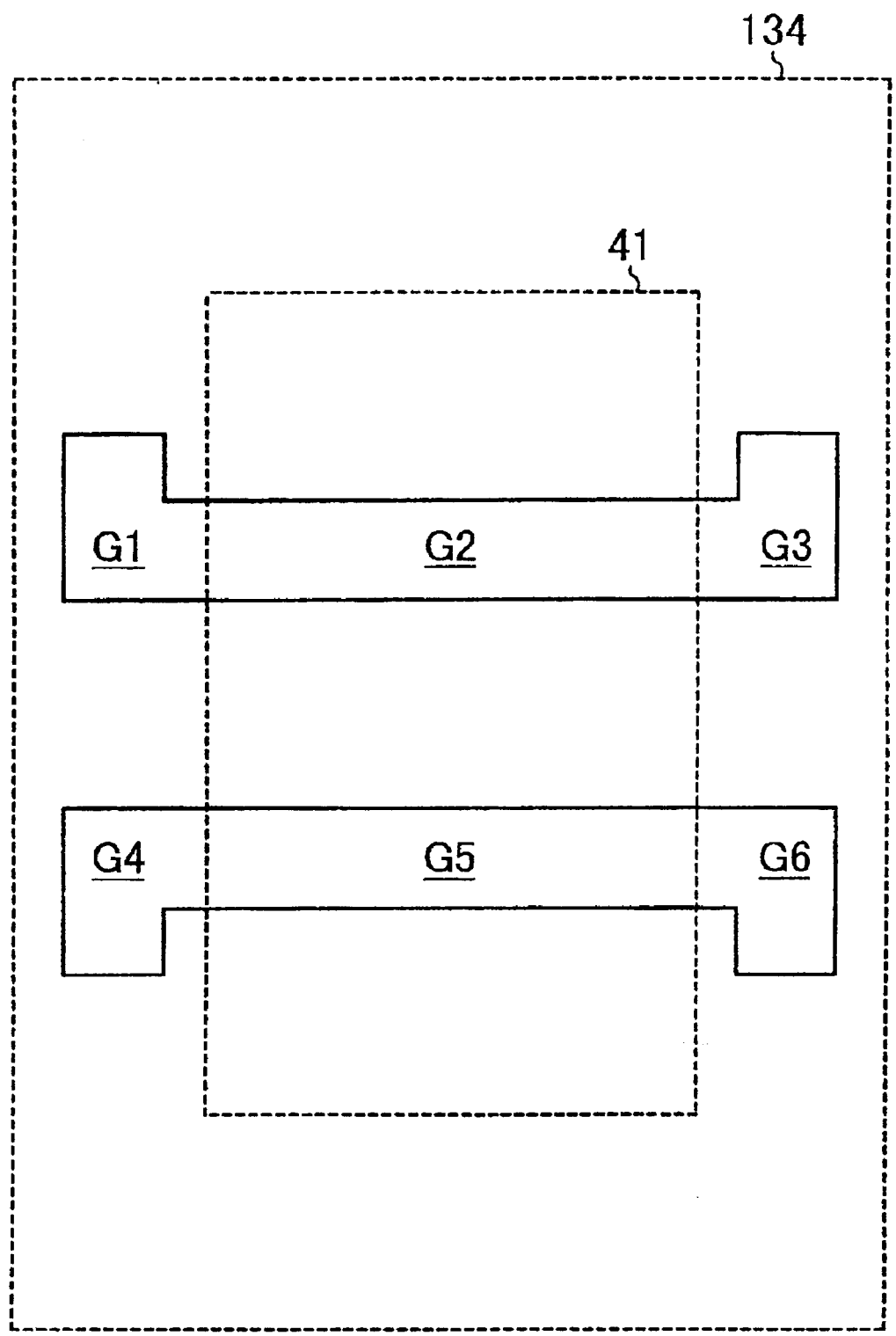
FIG. 29 is a plan view showing full segmentation patterns each as a removal unit of gate patterns and a positional relation thereof with other patterns.

FIG. 29 corresponds with FIG. 9, and individual gate patterns G1 to G6 which are obtained by segmenting gate patterns 421 and 422 at boundary of the N-type impurity pattern 41 are generated. Such a resulted pattern is stored in a storage area 13B as a full segmentation pattern 134. The above described information on basic cell arrangement is also stored in a storage area 13B.

A pattern modification block 10e generates a gate pattern from which an area corresponding with an individual contact hole pattern is missing, based on contact hole pattern data in a storage 12B, the segmentation pattern data and the basic cell arrangement information in the storage area 13B, and the generated gate pattern is stored in a storage area 15R.

Figure 30:
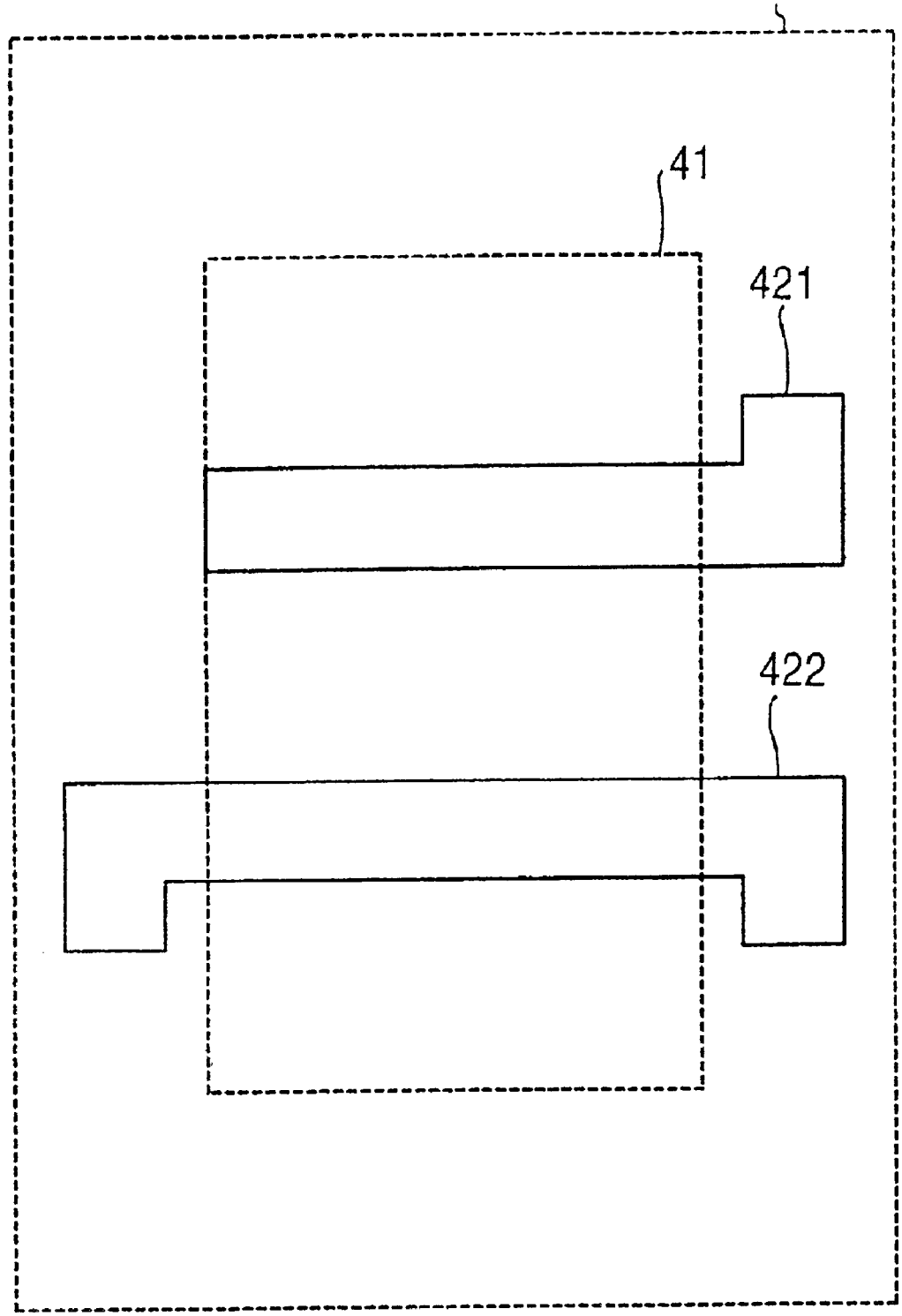
FIG. 30 is a plan view showing gate patterns partly removed in the pattern correction block of FIG. 26.

For example, it is investigated whether or not individual contact holes are existent ('1') in FIG. 28 at the corresponding positions which are the central positions of the individual segmentation patterns G1, G3, G4 and G6 in the full segmentation pattern 134. If existent, an individual segmentation pattern corresponding with an existing individual contact hole pattern is marked and an OR pattern between the marked segmentation pattern and the individual segmentation patterns G2 and G5 is obtained as a gate pattern 15R1 of FIG. 30. Such processing is repeated on all the basic cells in the embedded array 21.

It should be noted that as in FIG. 2, it is allowed alternatively that a removal pattern, corresponding with an area in which an individual contact hole pattern is missing, is firstly obtained, secondly, an exclusive OR is performed between the removal pattern and a gate pattern before modification, whereby a gate pattern 15R1 is obtained.

In step S5 of FIG. 1, a gate mask is prepared based on gate pattern data stored in the storage area 15R.

Since a non-use area of a gate pattern is removed in a circuit manufactured on a semiconductor substrate using such a mask, gate capacitance and capacitance between a gate and a metal line thereover are decreased compared with a prior art case, and thereby not only is power consumption decreased, but a signal propagation time is also shortened and an operating speed of a transistor is also improved.

Since a mask of modified gate is only substituted for an original one in a manufacturing stage, extension of a development period is small.

Figure 31:
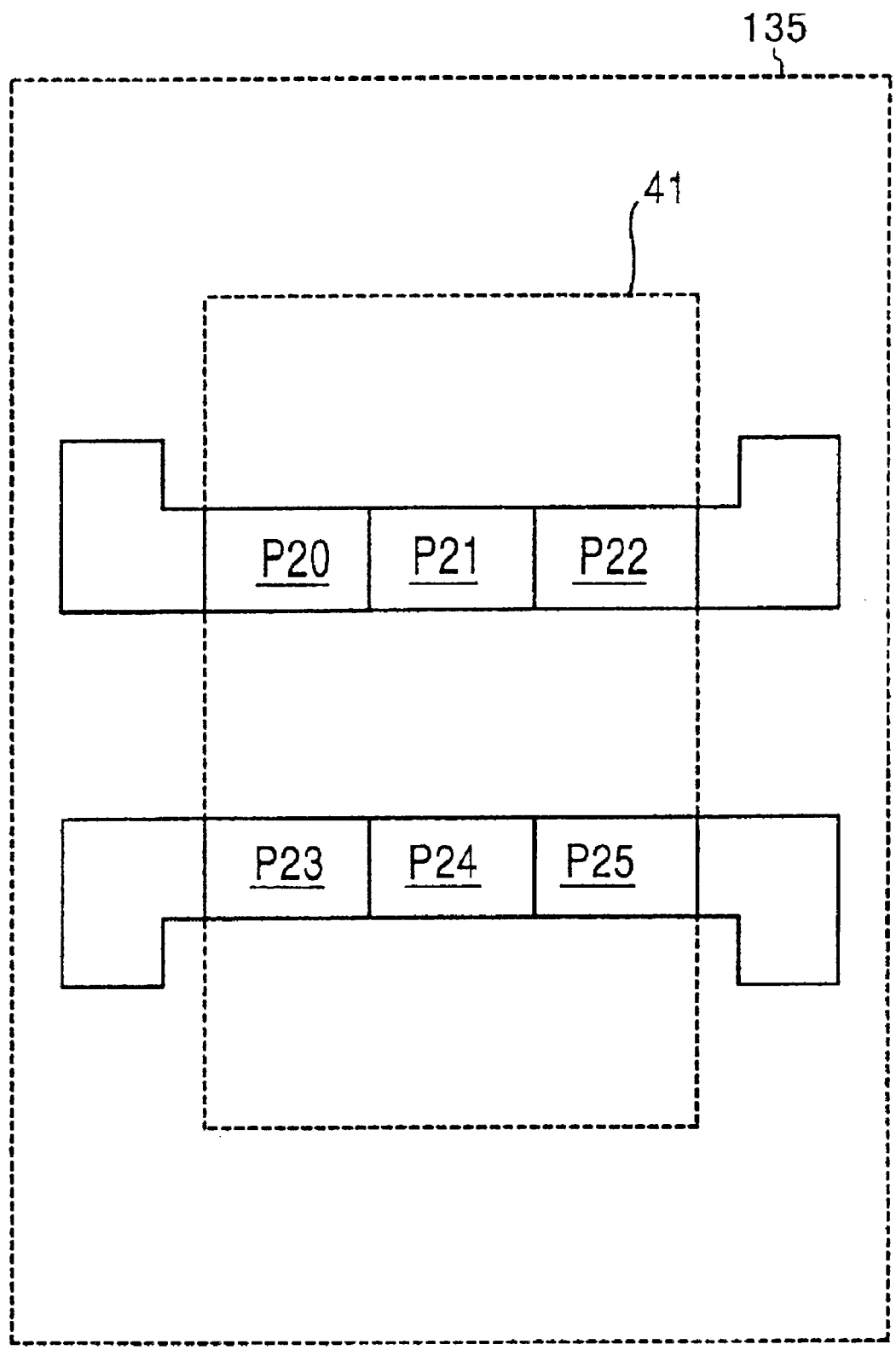
FIG. 31 is a plan view showing other segmentation patterns each as a removal unit of a gate pattern.
Figure 32:
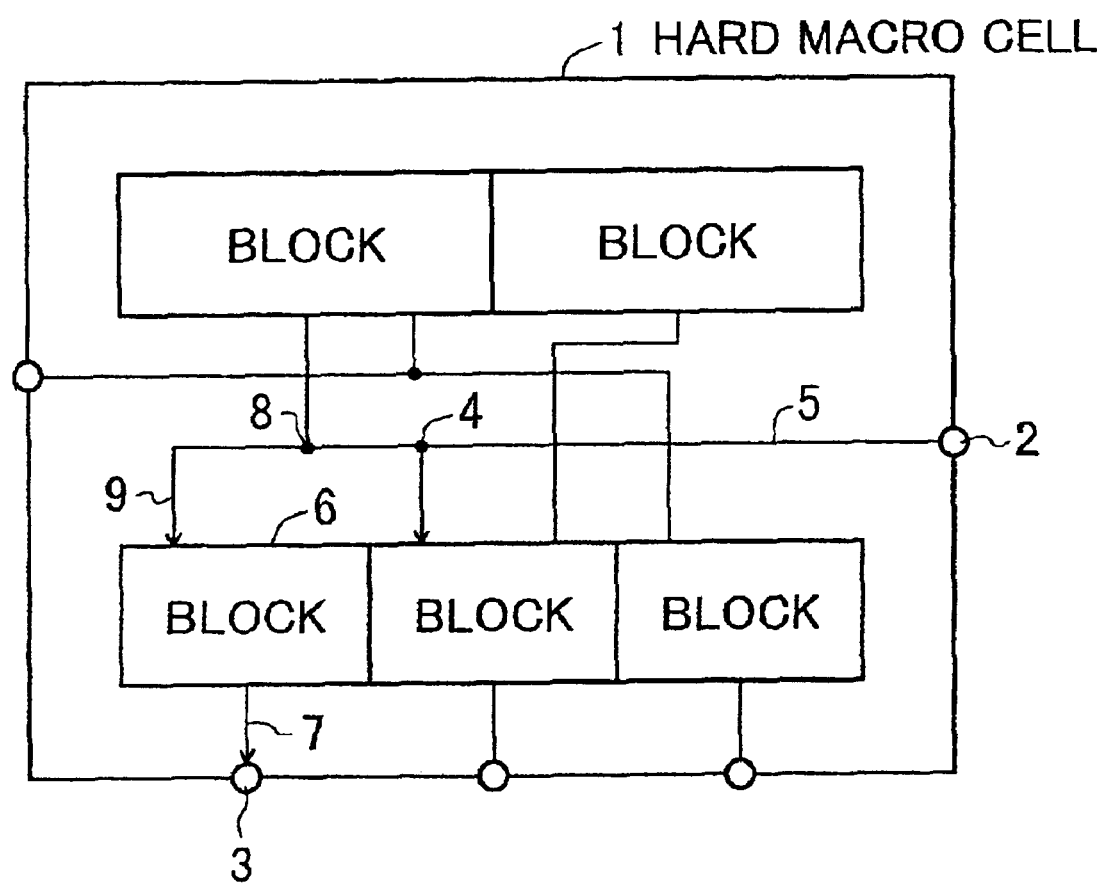
FIG. 32 is a block diagram showing a prior art hard macro cell.
Figure 33:
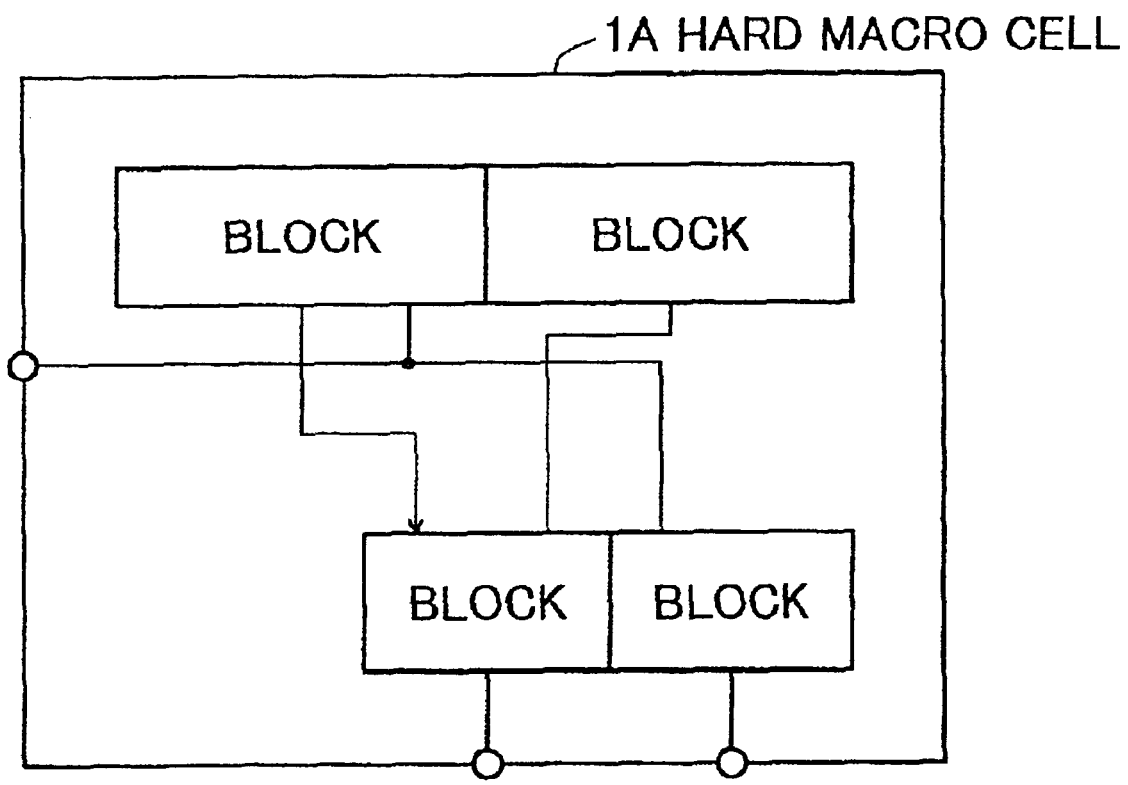
FIG. 33 is a block diagram showing a hard macro cell wherein a portion out of use in FIG. 32 has been removed according to a prior art method.

It should be noted that a variety of methods of segmenting a gate pattern can be conceived, and it is an alternative that for example, a gate segmentation pattern as shown in FIG. 31 is firstly made, and secondly an individual gate segmentation pattern is removed based on whether or not an area of the individual gate segmentation pattern is used as an element of a transistor. In this case, processing of FIG. 2 is performed in advance. Then, it is judged whether N-type region patterns are present on both sides of an individual gate segmentation pattern. If present, it is judged that the individual gate segmentation pattern is used in a transistor and the pattern is left as it is, but if not present, the pattern is removed.

Although preferred embodiments of the present invention has been described, it is to be understood that the invention is not limited thereto and that various changes and modifications may be made without departing from the spirit and scope of the invention.

For example, with performing two or more of the first to third embodiments, more non-use areas may be removed. Further, basic cells in an embedded array may be PNP or NPN bipolar transistors.

What is claimed is:

1. A method of designing and manufacturing a semiconductor integrated circuit having an embedded array, said embedded array having basic cells arranged in a matrix, said method comprising the step of, in a design stage, modifying layout pattern data of said embedded array by detecting and removing a non-use area in a basic cell based on layout data of contact holes,
   wherein said contact holes are for connection between an impurity region of transistors and a line thereover, said step comprising the steps of:
       segmenting a pattern of said impurity region into individual segmentation patterns each as a removal unit, each segmentation pattern corresponding with one or more of all individual contact hole patterns that can be arranged; and
       judging one of said removal units as said non-use area if an individual contact hole pattern corresponding with said one of said removal unit is not existent.

2. A method according to claim 1, wherein a pattern of said impurity region includes an area corresponding with a gate, said step further comprises:
   obtaining an OR pattern, as a synthesized removal pattern, between a pattern of said gate and said non-use area; and
   performing said modifying by removing said synthesized removal pattern from said pattern of said impurity region.

3. A method according to claim 2, wherein said modifying is performed by operating an exclusive OR between said pattern of said impurity region and said synthesized removal pattern.

4. A method according to claim 1, wherein said one or more individual contact hole patterns are those in line along a direction traversing a gate pattern.

5. A method according to claim 1, wherein said one or more individual contact hole patterns is one individual contact hole pattern, and an area of said removal unit excludes a close area to a gate.

6. A method of designing and manufacturing a semiconductor integrated circuit having an embedded array, said embedded array having basic cells arranged in a matrix, said method comprising the step of, in a design stage, modifying layout pattern data of said embedded array by detecting and removing a non-use area in a basic cell based on layout data of contact holes,
   wherein said contact holes are for connection between an impurity region and a line thereover having a substrate bias potential, said step comprising the steps of:
       segmenting a pattern of said impurity region into individual segmentation patterns each as a removal unit, each segmentation pattern corresponding with one of all individual contact hole patterns that can be arranged; and
       judging one of said removal units as said non-use area if an individual contact hole pattern corresponding with said one of said removal unit is not existent.

7. A method of designing and manufacturing a semiconductor integrated circuit having an embedded array, said embedded array having basic cells arranged in a matrix, said method comprising the step of, in a design stage, modifying layout pattern data of said embedded array by detecting and removing a non-use area in a basic cell based on layout data of contact holes,
   wherein said contact holes are for connection between a gate of a transistor and a line thereover, said step comprising the steps of:
       segmenting a pattern of said gate into individual segmentation patterns each as a removal unit, each segmentation pattern corresponding with one of all individual contact hole patterns that can be arranged; and
       judging one of said removal units as said non-use area if an individual contact hole pattern corresponding with said one of said removal unit is not existent.

8. A method according to claim 7, wherein said individual segmentation patterns have one that is a member of a single transistor assumed to exist; and judging said one of said individual segmentation patterns as said non-use area if said single transistor is not existent.

9. A method of designing and manufacturing a semiconductor integrated circuit having an embedded array, said embedded array having basic cells arranged in a matrix, said method comprising the step of, in a design stage, modifying layout pattern data of said embedded array by detecting and removing a non-use area in a basic cell based on layout data which represents that a contact hole is not existent.

* * * * *